(12) United States Patent
    Jeanson

(10) Patent No.: US 10,386,272 B2
(45) Date of Patent: Aug. 20, 2019

(54) TESTING DOWNHOLE TOOLS IN A SIMULATED ENVIRONMENT

(71) Applicant: Schlumberger Technology Corporation, Sugar Land, TX (US)

(72) Inventor: Eric Jeanson, Richmond, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 16/203,593

(22) Filed: Nov. 28, 2018

(65) Prior Publication Data

US 2019/0094111 A1   Mar. 28, 2019

Related U.S. Application Data

(62) Division of application No. 14/982,849, filed on Dec. 29, 2015, now Pat. No. 10,156,498.

(51) Int. Cl.
    *G01M 99/00* (2011.01)
    *G01V 99/00* (2009.01)
    *G06F 17/50* (2006.01)
    *E21B 47/00* (2012.01)

(52) U.S. Cl.
    CPC .......... *G01M 99/008* (2013.01); *E21B 47/00* (2013.01); *G01V 99/005* (2013.01); *G06F 17/5009* (2013.01)

(58) Field of Classification Search
    CPC .......... E21B 47/00; E21B 41/00; E21B 21/08; E21B 2041/0028; G06F 17/5009; G01V 1/50
    See application file for complete search history.

(56) References Cited

U.S. PATENT DOCUMENTS

| | | |
|---|---|---|
| 6,785,641 B1 | 8/2004 | Huang |
| 8,818,776 B2 | 8/2014 | Beck et al. |
| 2005/0197813 A1 | 9/2005 | Grayson |
| 2009/0083017 A1 | 3/2009 | Smart et al. |
| 2009/0198478 A1* | 8/2009 | Cuevas ................ E21B 43/122 703/10 |
| 2017/0184474 A1 | 6/2017 | Jeanson |

* cited by examiner

*Primary Examiner* — Jaehwan Oh

(57) ABSTRACT

Systems and methods may include sending, to a downhole tool emulator, at least one input signal that represents one or more conditions in a simulated well system. The downhole tool emulator may include one or more electronic components to be placed in a downhole tool. The at least one input signal may be generated based at least partially on a reservoir model of the simulated well system. The method may include receiving at least one output signal that represents a response of the downhole tool emulator to the one or more conditions. The method may also include sending, to the downhole tool emulator, at least one command that represents an operation of the downhole tool emulator. The at least one command may represent a change in the operation of the downhole tool emulator based at least partially on the one or more conditions and the response.

20 Claims, 13 Drawing Sheets

TESTING DOWNHOLE TOOLS IN A SIMULATED ENVIRONMENT

CROSS-REFERENCE TO RELATED APPLICATIONS

This application is a divisional application of U.S. patent application Ser. No. 14/982,849, filed on Dec. 29, 2015, the entirety of which is incorporated by reference herein.

BACKGROUND

Various processes exist to test the operation of downhole tools in hydrocarbon drilling and production. To test and validate proper design and operational behavior of a downhole tool, the downhole tool may be tested on an actual well. This process, however, may be time consuming and expensive, because it may include performing the actual drilling or production process. Moreover, if multiple tools must be tested for compatibility, multiple tests may be performed on the actual well.

In other processes, the operation of a downhole tool may be simulated. This process involves the simulation of a virtual downhole tool on a simulated well. This process, however, may not ensure the performance of the downhole tool because the actual and physical components of the downhole tool may not be utilized and may not provide high-fidelity results in terms of behavior of the actual physical equipment.

SUMMARY

Embodiments of the present disclosure may provide a method. The method may include sending, to a downhole tool emulator, at least one input signal that represents one or more conditions in a simulated well system. The downhole tool emulator may include one or more electronic components to be placed in a downhole tool. The at least one input signal may be generated based at least partially on a reservoir model of the simulated well system. The method may include receiving, from the downhole tool emulator, at least one output signal that represents a response of the downhole tool emulator to the one or more conditions. The method may also include sending, to the downhole tool emulator, at least one command that represents an operation of the downhole tool emulator. The at least one command may represent a change in the operation of the downhole tool emulator based at least partially on the one or more conditions and the response.

In an embodiment, the method may include determining one or more new conditions in the simulated well system based at least partially on the change in the operation of the downhole tool emulator and the reservoir model. The method may also include sending, to the downhole tool emulator, at least one new input signal that represents the one or more new conditions in the simulated well system.

In an embodiment, the method may include determining one or more new conditions in the simulated well system based at least partially on the at least one output signal that represents the response of the downhole tool emulator to the one or more conditions and the reservoir model. The method may also include sending, to the downhole tool emulator, at least one new input signal that represents the one or more new conditions in the simulated well system.

In an embodiment, the method may include converting the at least one input signal to one or more electrical signals that are compatible with the one or more electronic components to be placed in the downhole tool.

In an embodiment, the method may include collecting data that is representative of an operation of the downhole tool emulator. The data may include the one or more conditions, the response, and the at least one command. The method may include analyzing the data to determine proper operations of the one or more electronic components to be placed in a downhole tool.

In an embodiment, the one or more conditions may include a fault condition in at least one of the one or more electronic components and analyzing the data may include determining whether the at least one of the one or more electronic components responded properly to the fault condition.

In an embodiment, analyzing the data may include comparing the at least one command to at least one expected command that represents proper operation of the downhole tool emulator.

Embodiments of the present disclosure may provide another method. The method may include receiving, at a downhole tool emulator, at least one input signal that represents one or more conditions in a simulated well system. The downhole tool emulator may include one or more electronic components to be placed in a downhole tool. The at least one input signal may be generated based at least partially on a reservoir model of the simulated well system. The method may include transmitting, from the downhole tool emulator, at least one output signal that represents a response of the downhole tool emulator to the one or more conditions. The method may also include receiving, at the downhole tool emulator, at least one command that represents an operation of the downhole tool emulator. The at least one command may represent a change in the operation of the downhole tool emulator based at least partially on the one or more conditions and the response.

In an embodiment, the method may also include receiving, at a downhole tool emulator, one or more new conditions in the simulated well system based at least partially on the change in the operation of the downhole tool emulator and the reservoir model. The method may also include sending, from the downhole tool emulator, at least one new output signal that represents a response of the downhole tool emulator to the one or more new conditions.

In an embodiment, the method may include receiving, at a downhole tool emulator, one or more new conditions in the simulated well system based at least partially on the at least one output signal that represents the response of the downhole tool emulator to the one or more conditions and the reservoir model. The method may also include sending, from the downhole tool emulator, at least one new output signal that represents a response of the downhole tool emulator to the one or more new conditions.

In an embodiment, the method may include converting the at least one input signal to one or more electrical signals that are compatible with the one or more electronic components to be placed in the downhole tool.

In an embodiment, the method may include collecting data that is representative of an operation of the downhole tool emulator. The data may include the one or more conditions, the response, and the at least one command. The method may also include analyzing the data to determine proper operations of the one or more electronic components to be placed in a downhole tool.

In an embodiment, the one or more conditions may include a fault condition in at least one of the one or more electronic components and analyzing the data may include determining whether the at least one of the one or more electronic components responded properly to the fault condition.

In an embodiment, analyzing the data may include comparing the at least one command to at least one expected command that represents proper operation of the downhole tool emulator.

Embodiments of the present disclosure may provide a system. The system may include a downhole tool emulator including one or more downhole tool electronic components to be placed in a downhole tool. The system may also include a simulated surface system including one or more surface system electronic components to be placed in a surface system. The system may also include a computer system. The computer system may include one or more memory devices and one or more processors. The one or more memory devices may store instructions that cause the one or more processors to perform a method. The method may include simulating real-world operating conditions of the downhole tool. The method may also include simulating real-world control of the downhole tool based at least partially on one or more signals received from the downhole tool emulator.

In an embodiment, the one or more memory devices may store instructions that cause the one or more processors to perform the method that may further include sending, to the downhole tool emulator, at least one input signal that represents one or more conditions in a simulated well system. The at least one input signal may be generated based at least partially on a reservoir model of the simulated well system. The method may also include receiving, from the downhole tool emulator, at least one output signal that represents a response of the downhole tool emulator to the one or more conditions. Additionally, the method may include sending, to the downhole tool emulator from simulated surface system, at least one command that represents an operation of the downhole tool emulator. The at least one command represents a change in the operation of the downhole tool emulator based at least partially on the one or more conditions and the response.

In an embodiment, the one or more memory devices may store instructions that cause the one or more processors to perform the method that may further include generating the at least one input signal based at least partially on the reservoir model of the simulated well system.

In an embodiment, the one or more memory devices may store instructions that cause the one or more processors to perform the method that may further include determining one or more new conditions in the simulated well system based at least partially on the change in the operation of the downhole tool emulator and the reservoir model. The method may further include sending, to the downhole tool emulator, at least one new input signal that represents the one or more new conditions in the simulated well system.

In an embodiment, the one or more memory devices may store instructions that cause the one or more processors to perform the method that may further include determining one or more new conditions in the simulated well system based at least partially on the at least one output signal that represents a response of the downhole tool emulator to the one or more conditions and the reservoir model. The method may further include sending, to the downhole tool emulator, at least one new input signal that represents the one or more new conditions in the simulated well system.

In an embodiment, the one or more memory devices may store instructions that cause the one or more processors to perform the method that may further include collecting data that is representative of an operation of the downhole tool emulator. The data may include the one or more conditions, the response, and the at least one command. The method may further include analyzing the data to determine proper operations of the one or more downhole tool electronic components.

In an embodiment, the one or more conditions may include a fault condition in at least one of the one or more downhole tool electronic components, and analyzing the data may include determining whether the at least one of the one or more downhole tool electronic components responded properly to the fault condition.

In an embodiment, analyzing the data may include comparing the at least one command to at least one expected command that represents proper operation of the downhole tool emulator.

In an embodiment, the downhole tool emulator may convert the at least one input signal to one or more electrical signals that are compatible with the one or more electronic components to be placed in the downhole tool.

Embodiments of the present disclosure may provide another system. The system may include an emulated downhole tool that may include one or more downhole tool electronic components to be placed in a downhole tool and a downhole tool emulator that may communicate with the one or more downhole tool electronic components to be placed in the downhole tool and emulate one or more real-world operating conditions of the downhole tool. The system may also include a simulated surface system that may include one or more surface system electronic components to be placed in a surface system and a surface emulator that may communicate with the one or more surface system electronic components to be placed in a surface system and emulate real-world control of the downhole tool based at least partially on one or more signals received from the emulated downhole tool. The system may also include a computer system that may include one or more memory devices and one or more processors. The one or more memory devices may store instructions that cause the one or more processors to perform a method. The method may include sending, to the emulated downhole tool, at least one input signal that represents one or more conditions in a simulated well system. The at least one input signal may be generated by a reservoir model of the well system. The method may include receiving, from the emulated downhole tool via the simulated surface system, at least one output signal that represents a response of the emulated downhole tool to the one or more conditions. Additionally, the method may include sending, to the emulated downhole tool via the simulated surface system, at least one command that represents an operation of the emulated downhole tool. The at least one command may represent a change in the operation of the emulated downhole tool based at least partially on the one or more conditions and the response.

In an embodiment, the one or more memory devices may store instructions that cause the one or more processors to perform the method that may further include generating the at least one input signal based at least partially on the reservoir model of the simulated well system.

In an embodiment, the one or more memory devices may store instructions that cause the one or more processors to perform the method that may further include determining one or more new conditions in the simulated well system based at least partially on the change in the operation of the emulated downhole tool and the reservoir model. The method may also include sending, to the emulated downhole tool, at least one new input signal that represents the one or more new conditions in the simulated well system.

In an embodiment, the one or more memory devices may store instructions that cause the one or more processors to perform the method that may further include determining one or more new conditions in the simulated well system based at least partially on the at least one output signal that represents a response of the emulated downhole tool to the one or more conditions and the reservoir model. The method may also include sending, to the emulated downhole tool, at least one new input signal that represents the one or more new conditions in the simulated well system.

In an embodiment, the one or more memory devices may store instructions that cause the one or more processors to perform the method that may further include collecting data that is representative of an operation of the emulated downhole tool. The data may include the one or more conditions, the response, and the at least one command. The method may include analyzing the data to determine proper operations of the one or more downhole tool electronic components.

In an embodiment, the one or more conditions may include a fault condition in at least one of the one or more downhole tool electronic components, and analyzing the data may include determining whether the at least one of the one or more downhole tool electronic components responded properly to the fault condition.

In an embodiment, analyzing the data may include comparing the at least one command to at least one expected command that represents proper operation of the emulated downhole tool.

In an embodiment, the downhole tool emulator may convert the at least one input signal to one or more electrical signals that are compatible with the one or more downhole tool electronic components.

In an embodiment, the simulated surface system may include one or more physical interfaces to receive user input.

Embodiments of the present disclosure may provide another system. The system may include one or more electronic components to be placed in a downhole tool. The system may also include a computer system that includes one or more memory devices and one or more processors. The one or more memory devices may store instructions that cause the one or more processors to perform a method. The method may include receiving at least one input signal that represents one or more conditions in a simulated well system. The at least one input signal may be generated by a reservoir model of the simulated well system. The method may include converting the at least one input signal into at least one simulated input for the one or more electronic components. The method may also include sending at least one output signal that represents a response of the one or more electronic components to the one or more conditions.

In an embodiment, the one or more memory devices may store instructions that cause the one or more processors to perform the method that may further include generate the at least one input signal based at least partially on the reservoir model of the simulated well system.

In an embodiment, the one or more memory devices may store instructions that cause the one or more processors to perform the method that may further include collecting data that is representative of an operation of the one or more electronic components. The method may further include analyzing the data to determine proper operations of the one or more electronic components.

In an embodiment, the one or more conditions may include a fault condition in at least one of the one or more electronic components, and analyzing the data may include determining whether the at least one of the one or more electronic components responded properly to the fault condition.

In an embodiment, analyzing the data may include comparing the at least one command to at least one expected command that represents proper operation of the one or more electronic components.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DESCRIPTION OF EMBODIMENTS

Figure 1:
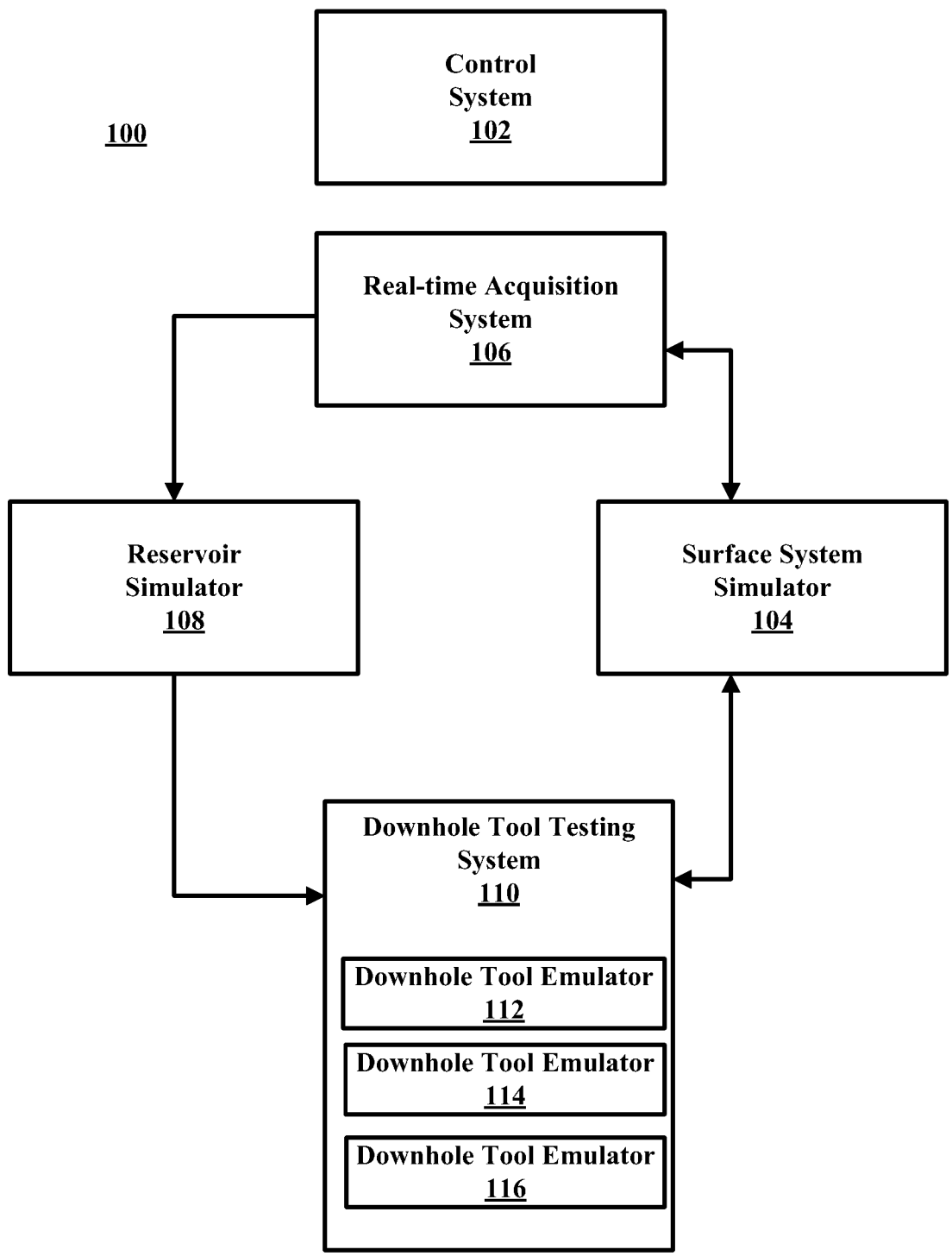
FIG. 1 illustrates an example of a system that includes various components to simulate and emulate a well system according to an embodiment.

Reference will now be made in detail to the various embodiments in the present disclosure, examples of which are illustrated in the accompanying drawings and figures. The embodiments are described below to provide a more complete understanding of the components, processes and apparatuses disclosed herein. Any examples given are intended to be illustrative, and not restrictive. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

Throughout the specification and claims, the following terms take the meanings explicitly associated herein, unless the context clearly dictates otherwise. The phrases "in some embodiments" and "in an embodiment" as used herein do not necessarily refer to the same embodiment(s), though they may. Furthermore, the phrases "in another embodiment" and "in some other embodiments" as used herein do not necessarily refer to a different embodiment, although they may. As described below, various embodiments may be readily combined, without departing from the scope or spirit of the present disclosure.

As used herein, the term "or" is an inclusive operator, and is equivalent to the term "and/or," unless the context clearly dictates otherwise. The term "based on" is not exclusive and allows for being based on additional factors not described, unless the context clearly dictates otherwise. In the specification, the recitation of "at least one of A, B, and C," includes embodiments containing A, B, or C, multiple examples of A, B, or C, or combinations of A/B, A/C, B/C, A/B/B/BB/C, AB/C, etc. In addition, throughout the specification, the meaning of "a," "an," and "the" include plural references. The meaning of "in" includes "in" and "on."

It will also be understood that, although the terms first, second, etc. may be used herein to describe various elements, these elements should not be limited by these terms. These terms are used to distinguish one element from another. For example, a first object or step could be termed a second object or step, and, similarly, a second object or step could be termed a first object, without departing from the scope of the invention. The first object and the second object are both objects, but they are not to be considered the same object. It will be further understood that the terms "includes," "including," "comprises" and/or "comprising," when used in this specification, specify the presence of stated features, integers, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

When referring to any numerical range of values herein, such ranges are understood to include each and every number and/or fraction between the stated range minimum and maximum. For example, a range of 0.5-6% would expressly include intermediate values of 0.6%, 0.7%, and 0.9%, up to and including 5.95%, 5.97%, and 5.99%. The same applies to each other numerical property and/or elemental range set forth herein, unless the context clearly dictates otherwise.

Attention is now directed to processing procedures, methods, techniques, and workflows that are in accordance with some embodiments. Some operations in the processing procedures, methods, techniques, and workflows disclosed herein may be combined and/or the order of some operations may be changed.

FIG. 1 illustrates an example of a system 100 that allows simulation and testing of a well system and hardware components utilized in the well system. In embodiments, the system 100 may provide a complete system that allows a real-world and real-time simulation and emulation of a well system.

In the example of FIG. 1, the system 100 may include a control system 102, a surface system simulator 104, a real-time acquisition system 106, a reservoir simulator 108, and a downhole tool testing system 110. The control system 102, the surface system simulator 104, the real-time acquisition system 106, the reservoir simulator 108, and the downhole tool testing system 110 may communicate and interact to facilitate a real-world and real-time simulation and emulation of the well system. Each of the control system 102, the surface system simulator 104, the real-time acquisition system 106, the reservoir simulator 108, and the downhole tool testing system 110 may represent a different system of the well system to be simulated and emulated. In some embodiments, the control system 102, the surface system simulator 104, the real-time acquisition system 106, the reservoir simulator 108, and the downhole tool testing system 110 may be implemented in separate and individual hardware and software systems. For example, any of the control system 102, the surface system simulator 104, the real-time acquisition system 106, the reservoir simulator 108, and the downhole tool testing system 110 may be implemented in a general purpose computer system, such as, for example, a laptop computer, desktop computer, server computer, and the like. Likewise, for example, any of the control system 102, the surface system simulator 104, the real-time acquisition system 106, the reservoir simulator 108, and the downhole tool testing system 110 may be implemented in a special purpose computer system, for example, a software appliance, blade server, and the like. In some embodiments, one or more of the control system 102, the surface system simulator 104, the real-time acquisition system 106, the reservoir simulator 108, and the downhole tool testing system 110 may be implemented in same hardware and software system.

In the example of FIG. 1, the control system 102 may be configured to provide overall control for the system 100. The control system 102 may be configured to communicate with any of the other components of the system 100, for example, the surface system simulator 104, the real-time acquisition system 106, the reservoir simulator 108, and the downhole tool testing system 110. In embodiments, the control system 102 may be configured to allow a user to configure the well system simulation and monitor the well system simulation during operation. For example, the control system 102 may include controls and interfaces to allow a user to define parameters for the well system simulation such as a reservoir to be simulated, downhole tools to be utilized during the simulation, data to be collected during the simulation, and the like. In some embodiments, the functionality of the control system 102 may be incorporated into one or more of the other components of the system 100, for example, the surface system simulator 104, the real-time acquisition system 106, the reservoir simulator 108, and the downhole tool testing system 110.

In the example of FIG. 1, the surface system simulator 104 may be configured to provide a real-time simulation interface for controlling operations of the well system to be simulated and emulated. For example, the surface system simulator 104 may include one or more controls and interfaces that allow a user to simulate usage of the downhole tools that are tested in the downhole tool testing system 110. In some embodiments, for example, the surface system simulator 104 may include the controls and interfaces of a winch system that simulates control and usage of the downhole tools that are tested in the downhole tool testing system 110. In some embodiments, the surface system simulator 104 may be coupled to the real-time acquisition system 106 and the downhole tool testing system 110. In some embodiments, as a user simulates usage of the downhole tools using the controls and interfaces, the surface system simulator 104 may be configured to send signals to the real-time acquisition system 106 and the downhole tool testing system 110 that represent commands entered by the user. In some embodiments, the surface system simulator 104 may be configured to receive data from the downhole tool testing system 110 and send the data to the real-time acquisition system 106.

In the example of FIG. 1, the real-time acquisition system 106 may be configured to collect data from the surface system simulator 104 and the downhole tool testing system 110. The real-time acquisition system 106 may be configured to process the data received from the surface system simulator 104 to determine commands entered and actions taken by a user on the surface system simulator 104 during operations. The real-time acquisition system 106 may be configured to process the data from the downhole tool testing system 110 and determine the data collected by the downhole tool testing system 110 and the responses of the downhole tool testing system 110 to user actions on the surface system simulator 104. The real-time acquisition system 106 may be configured to provide the collected data to the reservoir simulator 108. In some embodiments, for example, the real-time acquisition system 106 may include real-time data acquisition hardware and software such as MAXWELL®.

In the example of FIG. 1, the reservoir simulator 108 may be configured to simulate a reservoir of the simulated well system and generate one or more conditions in the wellbore of the simulated well system. The reservoir simulator 108 may be configured to utilize one or more reservoir models to determine the one or more conditions in the wellbore based on the data collected from the real-time acquisition system 106, the surface system simulator 104, and the downhole tool testing system 110. For example, the one or more conditions may include pressure in the wellbore, temperature in the wellbore, position of the downhole tools, flow rates of fluid in the wellbore, rate of penetration of the a drill, geological structure and formations in the wellbore, and the like. As the user interacts with the surface system simulator 104, and the downhole tool testing system 110 transmits data, the reservoir simulator 108 may be configured to utilize the one or more reservoir models to generate new conditions based on the user interactions and position of the downhole tools. The reservoir simulator 108 may be configured to send the one or more conditions to the downhole tool testing system 110 during operations of the system 100.

In the example of FIG. 1, the downhole tool testing system 110 may be configured to provide a platform to test and operate one or more downhole tool emulators, such as, for example, a downhole tool emulator 112, a downhole tool emulator 114, and a downhole tool emulator 116. In some embodiments, the downhole tool emulators 112, 114, 116 may represent or be different types of downhole tools. The types of downhole tools emulated may be any type of logging, sensing, measuring, and drilling tools utilized by a well or drilling system in a wellbore. In some embodiments, for example, downhole tool emulators 112, 114, 116 may represent different types of downhole tools. In some embodiments, for example, the downhole tool emulator 112, 114, 116 may represent different configurations of the same downhole tools.

In some embodiments, at least one of the downhole tool emulators 112, 114, 116 may provide a platform for testing real-word and physical components of downhole under simulated conditions. To test components of different downhole tools, the downhole tool emulators 112, 114, 116 may include the physical components, for example, electrical circuits, sensors, processors, and the like, that are found in real-world downhole tools. To operate and test the physical components, the downhole tool emulators 112, 114, 116 may include hardware, software, and combinations thereof that emulate the conditions found in the wellbore and feed the emulated conditions to the physical components. The downhole tool emulators 112, 114, 116 allow the physical components to be tested as if the physical components are operating in a real-world wellbore.

The downhole tool emulators 112, 114, 116 may be configured to receive the one or more conditions from the reservoir simulator 108 and convert the conditions to electrical signals that are readable by the physical components. The physical components may process the electrical signals received and output data that represents the one or more conditions sensed by the physical components. The output data may be received by the components of the system 100 for continued simulation and analysis of the operation of the downhole tools.

Figure 2A:
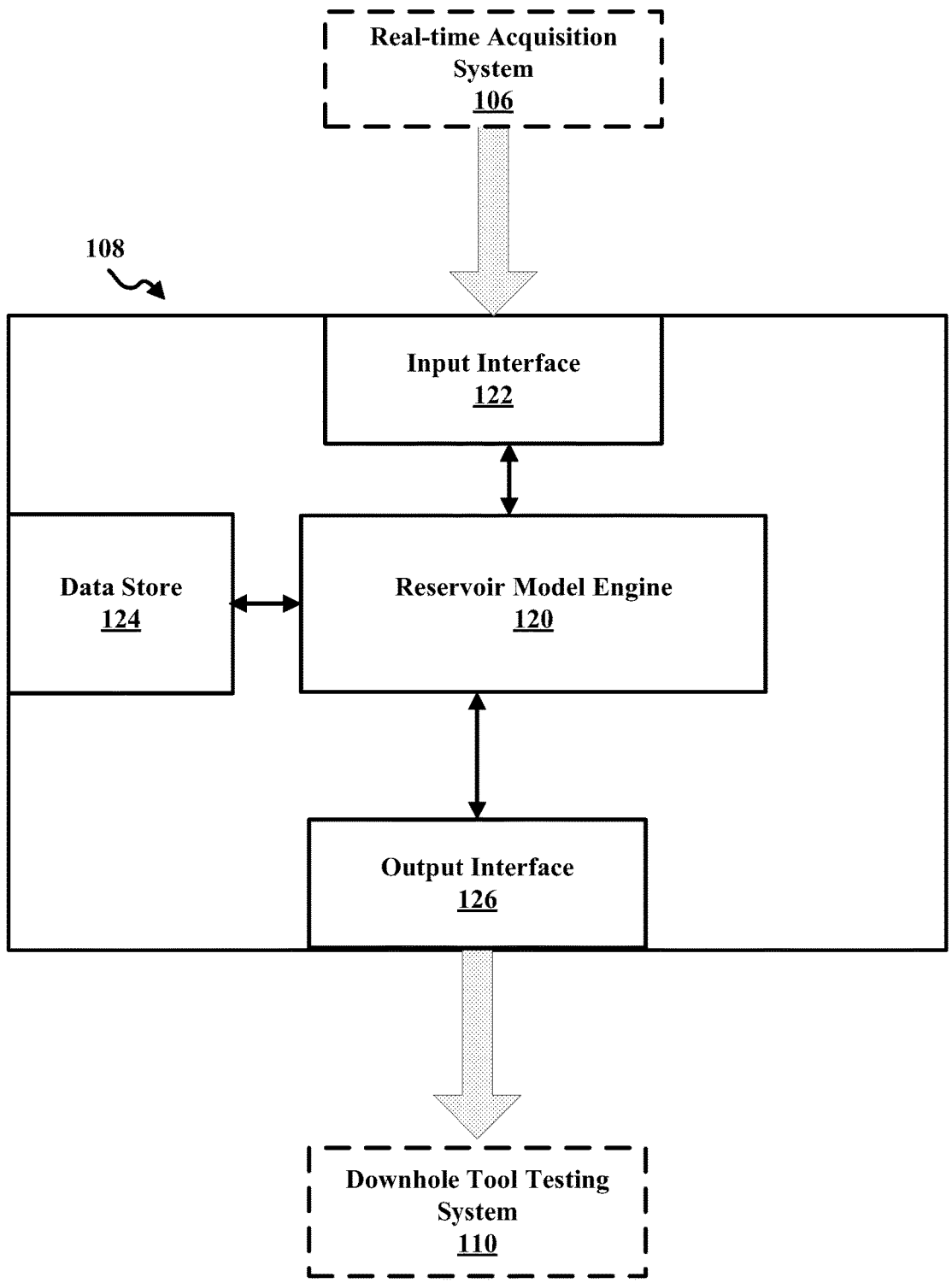
FIGS. 2A-2C illustrate additional examples of the various components to simulate and emulate a well system according to an embodiment.
Figure 2B:
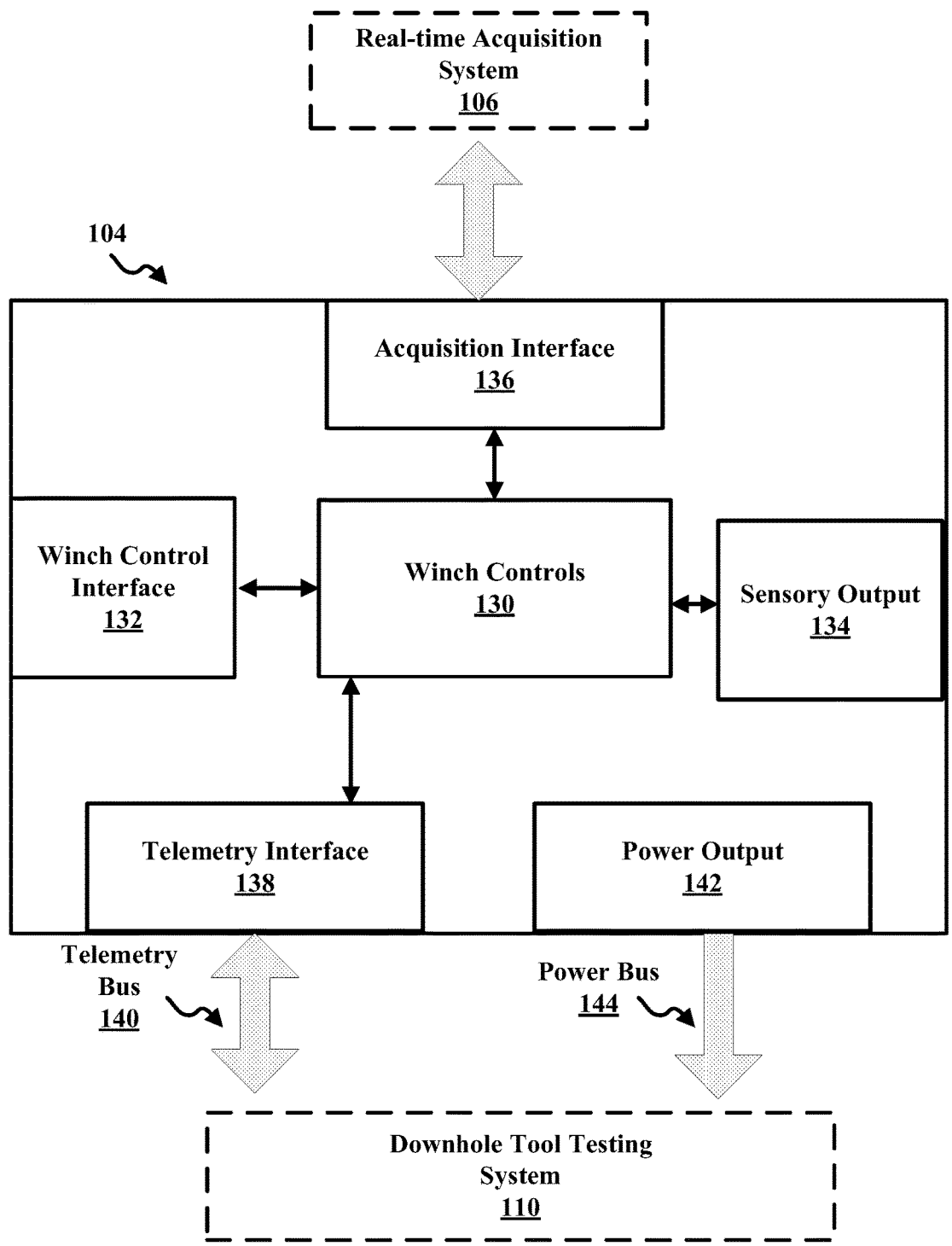
Figure 2C:
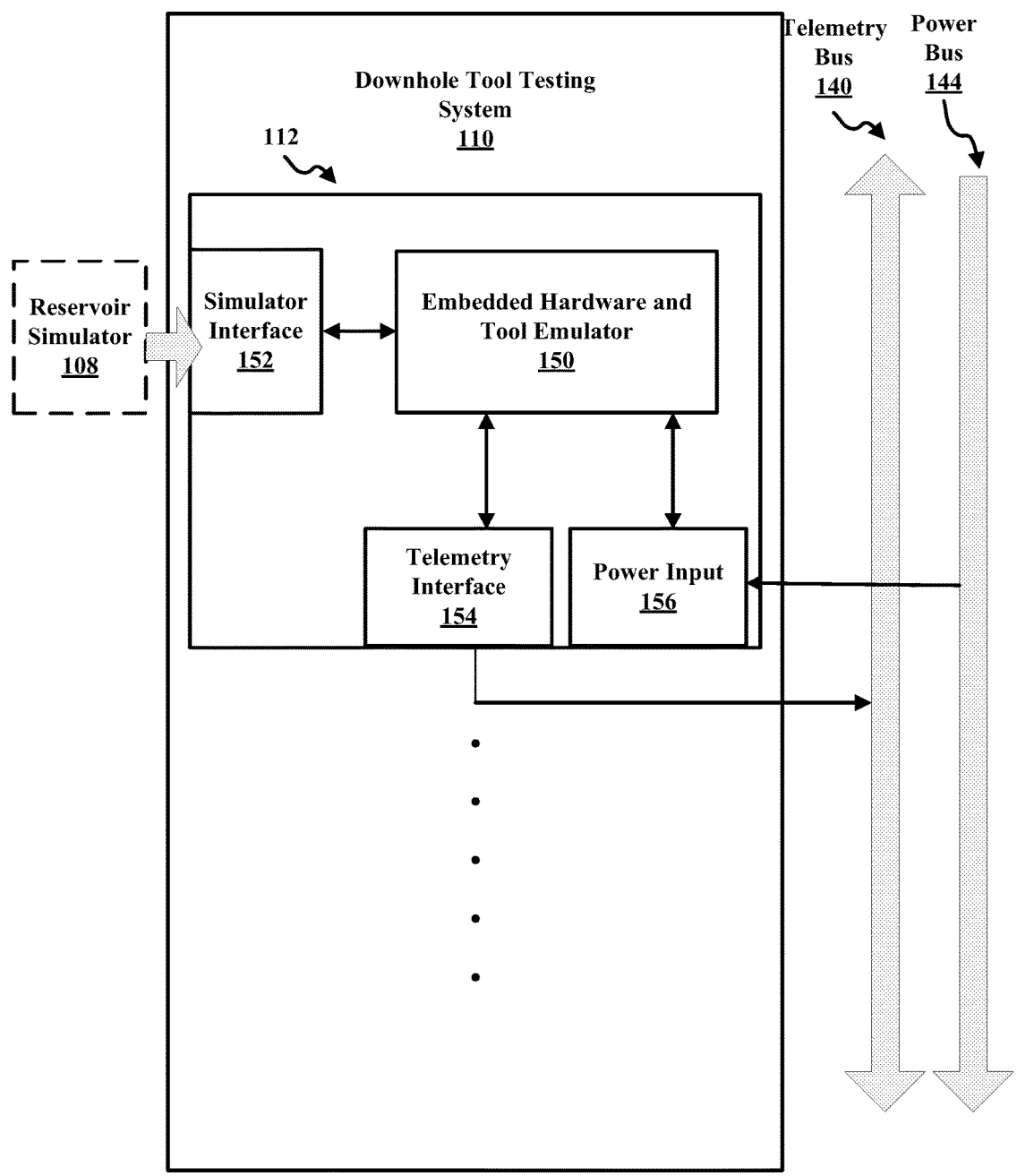

FIGS. 2A, 2B, and 2C illustrate more detailed examples of various components of the system 100. FIG. 2A illustrates an example of the reservoir simulator 108 that allows simulation of downhole conditions in the simulated well system. For example, as illustrated in FIG. 2A, the reservoir simulator 108 may include a reservoir model engine 120, an input interface 122, a data store 124, and an output interface 126. In some embodiments, the reservoir model engine 120 may be configured to generate one or more conditions in wellbore during simulation of the well system. For example, the reservoir model engine 120 may include any necessary hardware, software, logic, algorithms, and the like to generate one or more conditions in a wellbore.

In the example of FIG. 2A, the input interface 122 may be configured to receive data from the real-time acquisition system 106 and send the data to the reservoir model engine 120. In some embodiments, the data received may include data that is collected and processed by the real-time acquisition system 106, for example, the user interaction with the surface system simulator 104 and the data from the downhole tool testing system 110.

In the example of FIG. 2A, the data store 124 may store data that is utilized by the reservoir model engine 120 to generate the conditions in a wellbore. In embodiments, the data store 124 may include one or more reservoir models that represent different types of reservoirs. The data store 124 may also include data utilized by the reservoirs models to generate the one or more conditions, for example, seismic data, data from offset wells, data from previous drilling operations, and the like. In some embodiments, for example, the data may include entities. Entities may include earth entities or geological objects such as wells, surfaces, bodies, reservoirs, etc. In the reservoir simulator 108, the entities may include virtual representations of actual physical entities that are reconstructed for purposes of simulation. The entities may include entities based on data acquired via sensing, observation, etc. (e.g., the seismic data and other information). An entity may be characterized by one or more properties (e.g., a geometrical pillar grid entity of an earth model may be characterized by a porosity property). Such properties may represent one or more measurements (e.g., acquired data), calculations, etc.

In an example embodiment, the reservoir model engine 120 may operate in conjunction with a software framework such as an object-based framework. In such a framework, entities may include entities based on pre-defined classes to facilitate modeling and simulation. A commercially available example of an object-based framework is the MICROSOFT® .NET® framework, which provides a set of extensible object classes. In the .NET® framework, an object class encapsulates a module of reusable code and associated data structures. Object classes may be used to instantiate object instances for use in by a program, script, etc. For example, borehole classes may define objects for representing boreholes based on well data.

In the example of FIG. 2A, the reservoir model engine 120 may process information to conform to one or more attributes specified, which may include a library of attributes. Such processing may occur prior to input to the reservoir model engine 120. As an example, the reservoir model engine 120 may perform operations on input information based on one or more attributes specified. In an example embodiment, the reservoir model engine 120 may construct one or more models of well system, e.g., the geologic environment, which may be relied on to simulate behavior and conditions of the geologic environment (e.g., responsive to one or more acts, whether natural or artificial).

As an example, the reservoir model engine 120 may include one or more features of a simulator such as the ECLIPSE™ reservoir simulator, the INTERSECT™ reservoir simulator, etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., a thermal process such as steam-assisted gravity drainage (SAGD), etc.).

Additionally, as an example, the reservoir simulator 108 may include the commercially available OCEAN® framework where the reservoir model engine 120 is the commercially available PETREL® model-centric software package that hosts OCEAN® framework applications. In an example embodiment, the PETREL® software may be considered a data-driven application. The PETREL® software may include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 2A, the output interface 126 may be configured to send the one or more conditions generated by the reservoir model engine 120 to the downhole tool testing system 110. In some embodiments, for example, the output interface 126 may be an interface to a wired communication network with the downhole tool testing system 110. In some embodiments, for example, the output interface 126 may be an interface to a wireless communication network with the downhole tool testing system 110.

FIG. 2B illustrates an example of the surface system simulator 104 that allows a user to interact with the well system being simulated. In the example of FIG. 2B, the surface system simulator 104 may include a winch controls 130, a winch control interface 132, sensory output 134, an acquisition interface 136, a telemetry interface 138, and a power output 142.

In the example of FIG. 2B, the winch controls 130 may include any hardware, software, and combination thereof to simulate operation of the downhole tools of the downhole tool testing system 110. The winch control interface 132 may include one or more physical interfaces and devices to allow a user to controls the surface system simulator 104. The winch control interface 132 may allow the user to enter commands to direct the operations of the emulated downhole tools of the downhole tool testing system 110. For example, the winch control interface 132 may include one or more joysticks that allow a user to simulate the movement of the downhole tools.

In the example of FIG. 2B, the sensory output 134 may include displays and interfaces that provide an output to a user of the current operation of the surface system simulator 104. In some embodiments, for example, the sensory output 134 may include graphical displays, indicators, data meters, and the like. The sensory output 134 may receive data from the winch controls 130 that represent to commands from the winch control interface 132 and data from the downhole tool testing system 110 that represent simulated operation of the downhole tools.

In the example of FIG. 2B, the acquisition interface 136 may provide a communication path between the surface system simulator 104 and the real-time data acquisition system 106. In some embodiments, for example, the acquisition interface 136 may be an interface to a wired communication network. In some embodiments, for example, the acquisition interface 136 may be an interface to a wireless communication network.

In the example of FIG. 2B, the telemetry interface 138 may be coupled to a telemetry bus 140. The telemetry bus 140 may provide a communication path between the surface system simulator 104 and the downhole tool testing system 110. The surface system simulator 104 may utilize the telemetry interface 138 and the telemetry bus 140 to transmit data to the downhole tool testing system 110 and to receive data from the downhole tool emulators of the downhole tool testing system 110. In some embodiments, for example, the telemetry interface 138 may be formed over a wired communication path. In some embodiments, for example, the telemetry interface 138 may be formed over a wireless communication path.

In the example of FIG. 2B, the power output 142 may be coupled to a power bus 144. The power output 142 may provide power over the power bus 144 to the downhole tool emulators of the downhole tool testing system 110.

FIG. 2C illustrates an example of the downhole tool testing system 110 that allows the physical components of a downhole tool to be tested. In the example of FIG. 2C, the downhole tool testing system 110 may include one or more downhole tool emulators 112. In the example of FIG. 2C, the downhole tool emulator 112 may include an embedded hardware and tool emulator 150, a simulator interface 152, a telemetry interface 154, and a power input 156.

In the example of FIG. 2C, the embedded hardware and tool emulator 150 may include the physical components, for example, electrical circuits, sensors, processors, and the like, that are found in real world downhole tools. To operate and test the physical components, the embedded hardware and tool emulator 150 may include hardware, software, and combinations thereof that emulate the conditions found in the wellbore and feed the emulated conditions to the physical components. The embedded hardware and tool emulator 150 may allow the physical components to be tested as if the physical components are operating in a real-world wellbore.

In embodiments, for example, the embedded hardware and tool emulator 150 may be configured to receive the one or more conditions from the reservoir simulator 108 and convert the conditions to electrical signals that are readable by the physical components. The physical components may process the electrical signals received and output data that represents the one or more conditions sensed by the physical components. The data may be output to the surface system simulator 104, via the telemetry interface 154, for continued simulation and analysis of the operation of the downhole tools.

In the example of FIG. 2C, the simulator interface 152 may be configured to receive the one or more conditions generated by the reservoir simulator 108. In some embodiments, for example, the simulator interface 152 may be an interface to a wired communication network with the reservoir simulator 108. In some embodiments, for example, the simulator interface 152 may be an interface to a wireless communication network with the reservoir simulator 108.

In the example of FIG. 2C, the telemetry interface 154 may be coupled to the telemetry bus 140. The telemetry bus 140 may provide a communication path between the surface system simulator 104 and the downhole tool emulator 112. The downhole tool emulator 112 may utilize the telemetry interface 154 and the telemetry bus 140 to transmit data to the surface system simulator 104 and to receive data from the surface system simulator 104. In some embodiments, for example, the bus 140 may be formed over a wired communication path. In some embodiments, for example, the bus 140 may be formed over a wireless communication path.

In the example of FIG. 2C, the power input 156 may be coupled to the power bus 144. The power input 156 may receive power from the power bus 144 to operate the downhole tool emulators.

Figure 3:
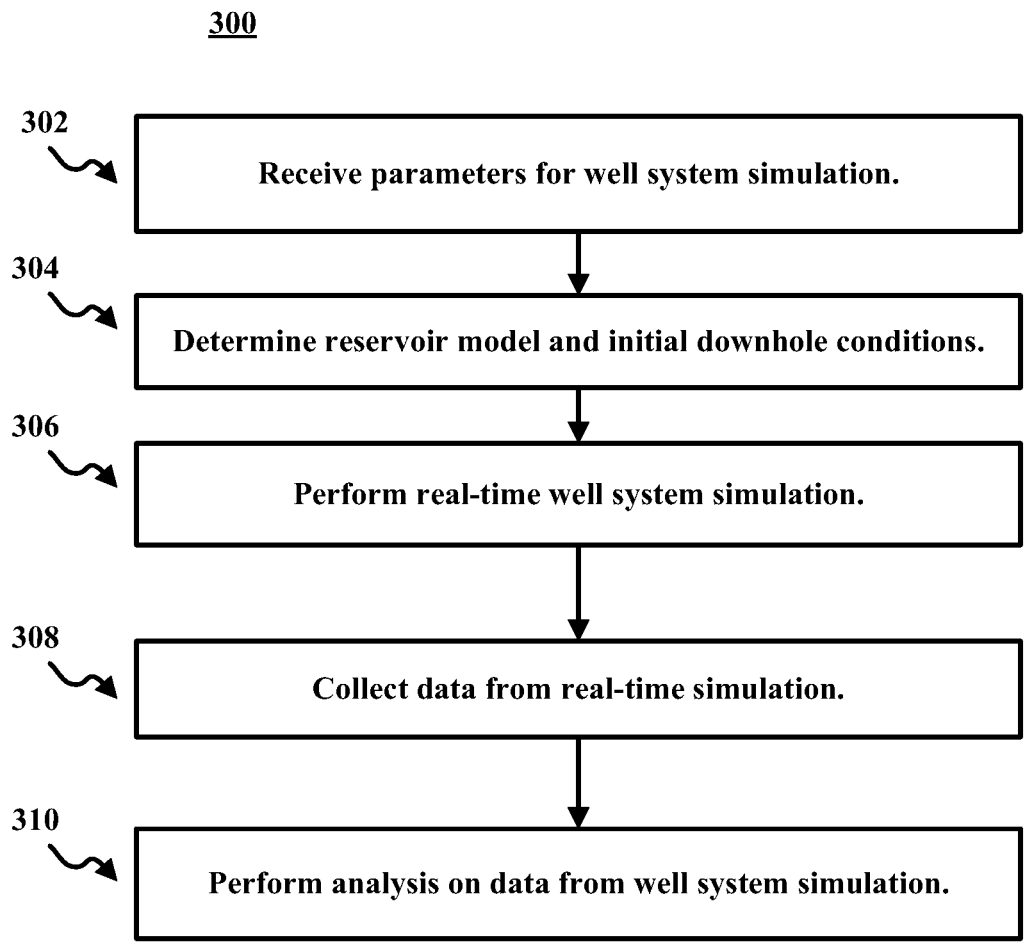
FIG. 3 illustrates a flowchart of an example of a method for simulating a well system according to an embodiment.

FIG. 3 illustrates a flowchart of a method 300 for performing a real-time well system simulation. As in operation 202, parameters may be received for the well system simulation. The parameters may include any data that can be utilized to perform the well system simulation. For example, the parameters may include a particular well to perform the well system simulation, an identification of the downhole tools tested, an initial state of the well system to be simulated, and other initialization parameters. In embodiments, the one or more of the parameters may be provided by a user of the system 100, described above. In embodiments, the one or more of the parameters may be collected by or determined independently by the system 100.

In operation 304, a reservoir model and initial downhole conditions may be determined. In embodiments, for example, the parameters may be utilized to select and configure one or more models for the well system simulator. For example, the parameters may be entered into the reservoir simulator 108. Based on the parameters, the reservoir simulator 108 may configure one or more reservoir models for generating one or more conditions for wellbore. In some embodiments, for example, based on the parameters, an initial downhole conditions may be generated by the reservoir simulator 108 such as initial location of the downhole tools of the downhole tool testing system 110, and initial conditions at the initial location such as pressure in the wellbore, temperature in the wells bore, position of the downhole tools, flow rates of fluid in the wellbore, rate of penetration of the a drill, geological structure and formations in the wellbore, and the like.

In operation 306, a real-time well system simulation may be performed. In embodiments, the reservoir simulator 108 generates one or more conditions for the downhole tool testing system 110. The one or more conditions may sensed by the downhole tool emulators of the downhole tool testing system 110 and fed back to the reservoir simulator 108 via the surface system simulator 104 and the real-time acquisition system 106. The user operation on the surface system simulator 104 may be also fed back to the reservoir simulator 108. In response, the reservoir simulator 108 may generate one or more conditions based on the operation of the downhole tool emulators. This loop may continue during the simulation to emulate the operation of a well system.

For example, the initial conditions may be sent to the downhole tool testing system 110. The initial conditions may be received by the downhole tool emulators and passed to the physical components of the downhole tool included in the downhole tool emulators. The data from the physical components of the downhole tool may then be transmitted to the surface system simulator 104 and the real-time acquisition system 106. In embodiments, as the simulation proceeds, a user may provide commands to the surface system simulator 104 that represent operation of the downhole tools. The commands and the data collected from the downhole tool testing system 110 may be sent to the reservoir simulator 108. The reservoir simulator 108 may generate new conditions based on the commands and the data collected from the downhole tool testing system 110 that represent changes based on the operation of the downhole tools. The process may be repeated as new data is received from the downhole tools and the user provides new commands.

In operation 308, data may be collected from the real-time well system simulation. In some embodiments, the data may include the data output by the downhole tool testing system 110, the commands and actions by a user on the surface system simulator 104, the model used by the reservoir simulator 108, the one or more conditions generated by the reservoir simulator during the simulation, and the like. In some embodiments, for example, the data may be collected by the control system 102. In some embodiments, the data may be collected by any of the components of the system 100.

In operation 310, analysis may be performed on the data from the well system simulation. In some embodiments, the analysis may be performed to determine the function of components of the simulated well system or a user interaction with the simulated well system.

In some embodiments, for example, the data collected may be analyzed to determine if the downhole tools operated properly. For example, the one or more conditions, generated with the reservoir simulator 108, that were provided to the downhole tool emulators may be matched to the data that was generated by the physical components of the downhole tool emulators. Likewise, for example, the data output by the downhole tool emulators may be analyzed to determine if error or faults were generated during simulation.

In some embodiments, for example, the data collected may be analyzed to determine for training purposes. For example, the commands provided to the surface system simulator 104 may be compared to standard procedures to determine if the user properly operated the simulated well system.

Figure 4:
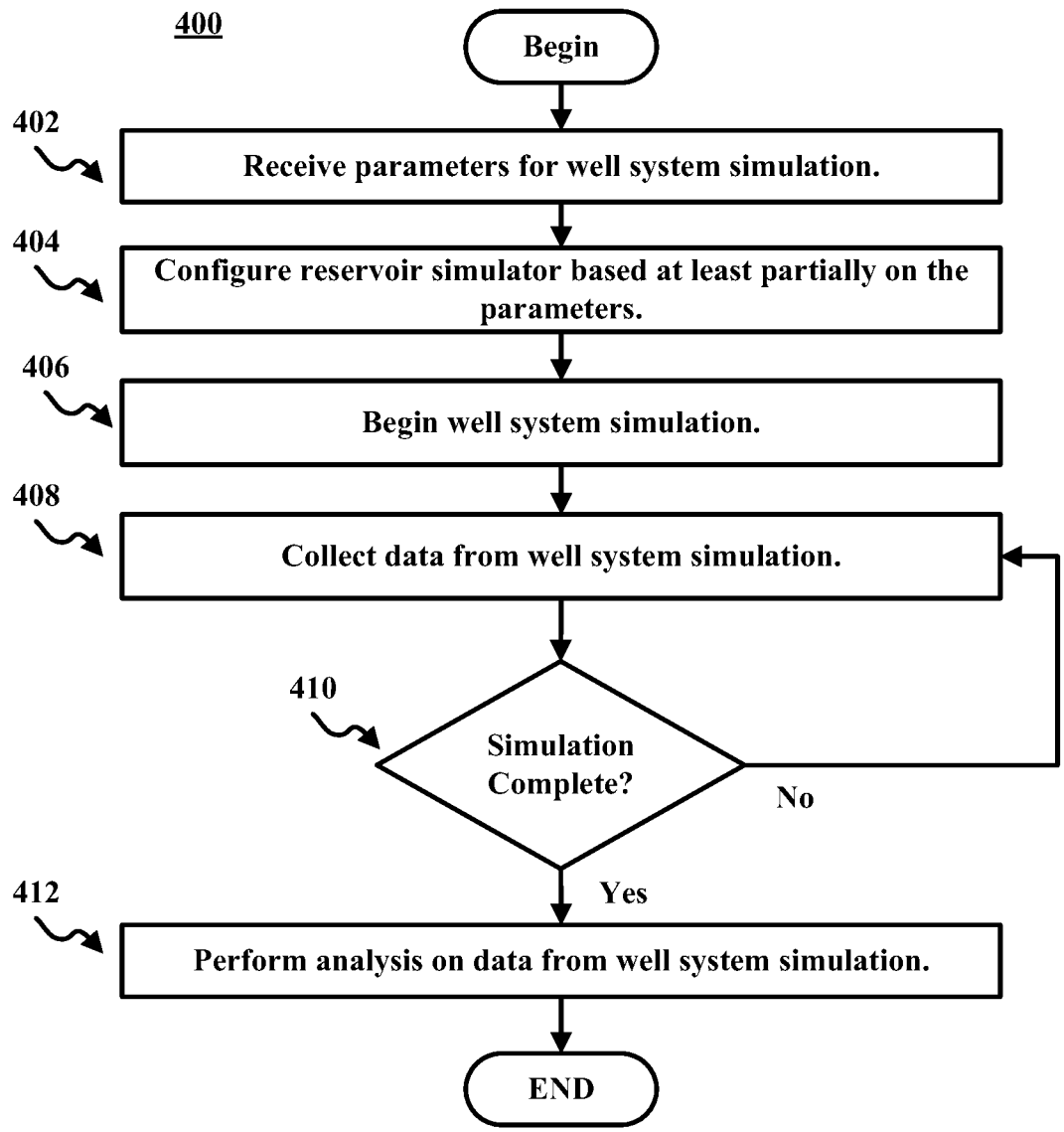
FIG. 4 illustrates a flowchart of another example of a method for simulating a well system according to an embodiment.
Figure 5:
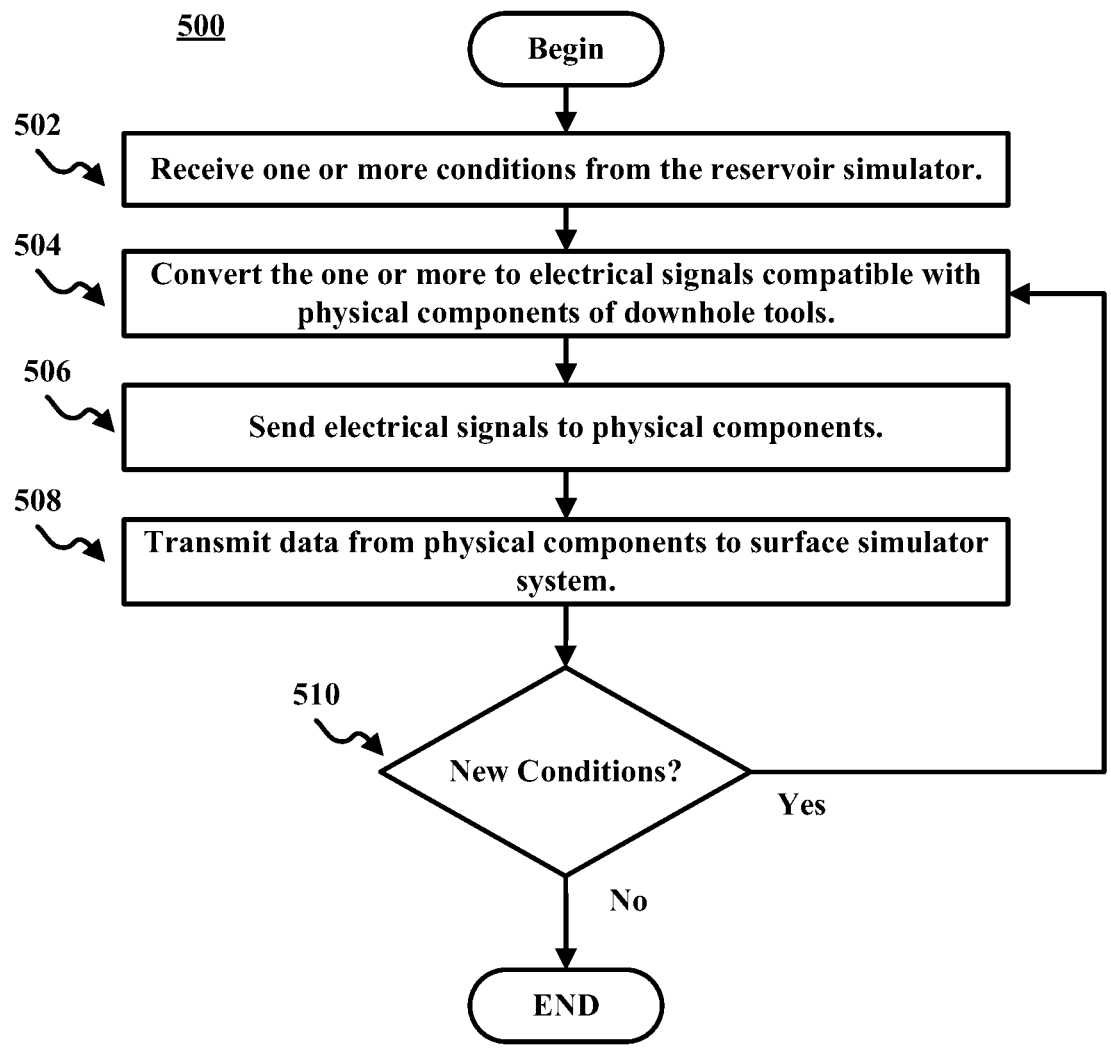
FIG. 5 illustrates a flowchart of an example of a method for emulating a downhole tool according to an embodiment.

FIGS. 4 and 5 illustrate flowcharts of methods that may be performed by the system 100. In some embodiments, the methods illustrated in FIGS. 4 and 5 may be performed simultaneously during the simulation of a well system. In some embodiments, any of the methods illustrated in FIGS. 4 and 5 may be performed individually.

FIG. 4 illustrates a flowchart of a method 400 for initiating a well system simulation and collecting data from the well system simulation. As illustrated in FIG. 4, the method 400 may begin with receiving parameters for the well system simulation, in operation 402. The parameters may include any data that may be utilized to perform the well system simulation. For example, the parameters may include a particular well to perform the well system simulation, an identification of the downhole tools tested, an initial state of the well system to be simulated, and other initialization parameters. In embodiments, the one or more of the parameters may be provided by a user of the system 100, described above. In embodiments, the one or more of the parameters may be collected by or determined independently by the system 100. In some embodiments, the one or more of the parameters may be provided by a user of the system 100, for example, using the control system 102. In some embodiments, the one or more of the parameters may be collected by or determined independently by any component of the system 100, for example, one or more of the control system 102, the surface system simulator 104, the real-time acquisition system 106, the reservoir simulator 108, and the downhole tool testing system 110.

In operation 404, the reservoir simulator may be configured based at least partially on the parameters. In embodiments, for example, based on the parameters, the reservoir simulator 108 may configure one or more reservoir models for generating one or more conditions for wellbore. In some embodiments, for example, based on the parameters, an initial downhole conditions may be generated by the reservoir simulator 108 such as initial location of the downhole tools of the downhole tool testing system 110, and initial conditions at the initial location such as pressure in the wellbore, temperature in the wells bore, position of the downhole tools, flow rates of fluid in the wellbore, rate of penetration of the a drill, geological structure and formations in the wellbore, and the like.

In operation 406, the well system simulation may begin. For example, the initial conditions may be sent to the downhole tool testing system 110. The initial conditions may be received by the downhole tool emulators and passed to the physical components of the downhole tool included in the downhole tool emulators. The data from the physical components of the downhole tool may then be transmitted to the surface system simulator 104 and the real-time acquisition system 106. In embodiments, as the simulation proceeds, a user may provide commands to the surface system simulator 104 that represent operation of the downhole tools. The commands and the data collected from the downhole tool testing system 110 may be sent to the reservoir simulator 108. The reservoir simulator 108 may generate new conditions based on the commands and the data collected from the downhole tool testing system 110 that represent changes based on the operation of the downhole tools. The process may be repeated as new data is received from the downhole tools and the user provides new commands.

In operation 408, data may be collected from the well system simulation. In some embodiments, the data may include the data output by the downhole tool testing system 110, the commands and actions by a user on the surface system simulator 104, the model used by the reservoir simulator 108, the one or more conditions generated by the reservoir simulator during the simulation, and the like. In some embodiments, for example, the data may be collected by the control system 102. In some embodiments, the data may be collected by any of the components of the system 100.

In operation 410, it may be determined if the well system simulation is complete. If the well system simulation is still in progress, data may continue to be collected in operation 408.

If the well system simulation is complete, an analysis may be performed on the data from the well system simulation, in operation 412. In some embodiments, the analysis may be performed to determine the function of components of the simulated well system or a user interaction with the simulated well system.

In some embodiments, for example, the data collected may be analyzed to determine if the downhole tools operated properly. For example, the one or more conditions, generated with the reservoir simulator 108, that were provided to the downhole tool emulators may be matched to the data that was generated by the physical components of the downhole tool emulators. Likewise, for example, the data output by the downhole tool emulators may be analyzed to determine if error or faults were generated during simulation.

In some embodiments, for example, the data collected may be analyzed to determine for training purposes. For example, the commands provided to the surface system simulator 104 may be compared to standard procedures to determine if the user properly operated the simulated well system.

In embodiments, reports and summaries may be generated and output by the system 100 that detail the data collected and results of the analysis. For example, in some embodiments, reports and summaries may be generated that detail the operations of the downhole tool emulators and the physical components of the downhole tool emulators. In some embodiment, for example, reports and summaries may be generated that detail the user's operation of the simulated well system. The reports and summaries may be generated and output by any component of the system 100, for example, the control system 102, the surface system simulator 104, the real-time acquisition system 106, the reservoir simulator 108, and the downhole tool testing system 110.

FIG. 5 illustrates a flowchart of a method 500 for operation of the downhole tool emulators. As illustrated in FIG. 5, the method 500 may begin with receiving one or more conditions from the reservoir simulator, in operation 502. In some embodiments, for example, the one or more conditions may be received from the reservoir simulator 108 via the simulator interface 152.

In operation 504, the one or more conditions may be converted to electrical signals that are compatible with the physical components of the downhole tools. In some embodiments, for example, the embedded hardware and tool emulator 150 may be configured to receive the one or more conditions and covert the conditions to electrical signal. For example, if one of the conditions is a temperate at a particular reading, the embedded hardware and tool emulator 150 may convert the particular reading to an electrical signal that would be properly read by a temperature sensor, if functioning properly, as the particular reading. In operation 506, the electrical signal may be sent to the physical components.

In operation 508, the data from the physical components may be transmitted to the surface system simulator. In some embodiments, for example, the data may be transmitted to the surface system simulator 104 via the telemetry bus 140.

In operation 510, it may be determined if one or more new conditions are received from the reservoir simulator. For example, the one or more conditions previously sensed by the downhole tool emulator 112 of the downhole tool testing system 110 may be fed back to the reservoir simulator 108 via the surface system simulator 104 and the real-time acquisition system 106. The user operation on the surface system simulator 104 may be also fed back to the reservoir simulator 108. In response, the reservoir simulator 108 may generate one or more conditions based on the operation of the downhole tool emulators. In response, the downhole tool emulator 112 may repeat operations 502-508 to determine the response of the physical components of the downhole too. This loop may continue during the simulation to emulate the operation of a well system.

Figure 6:
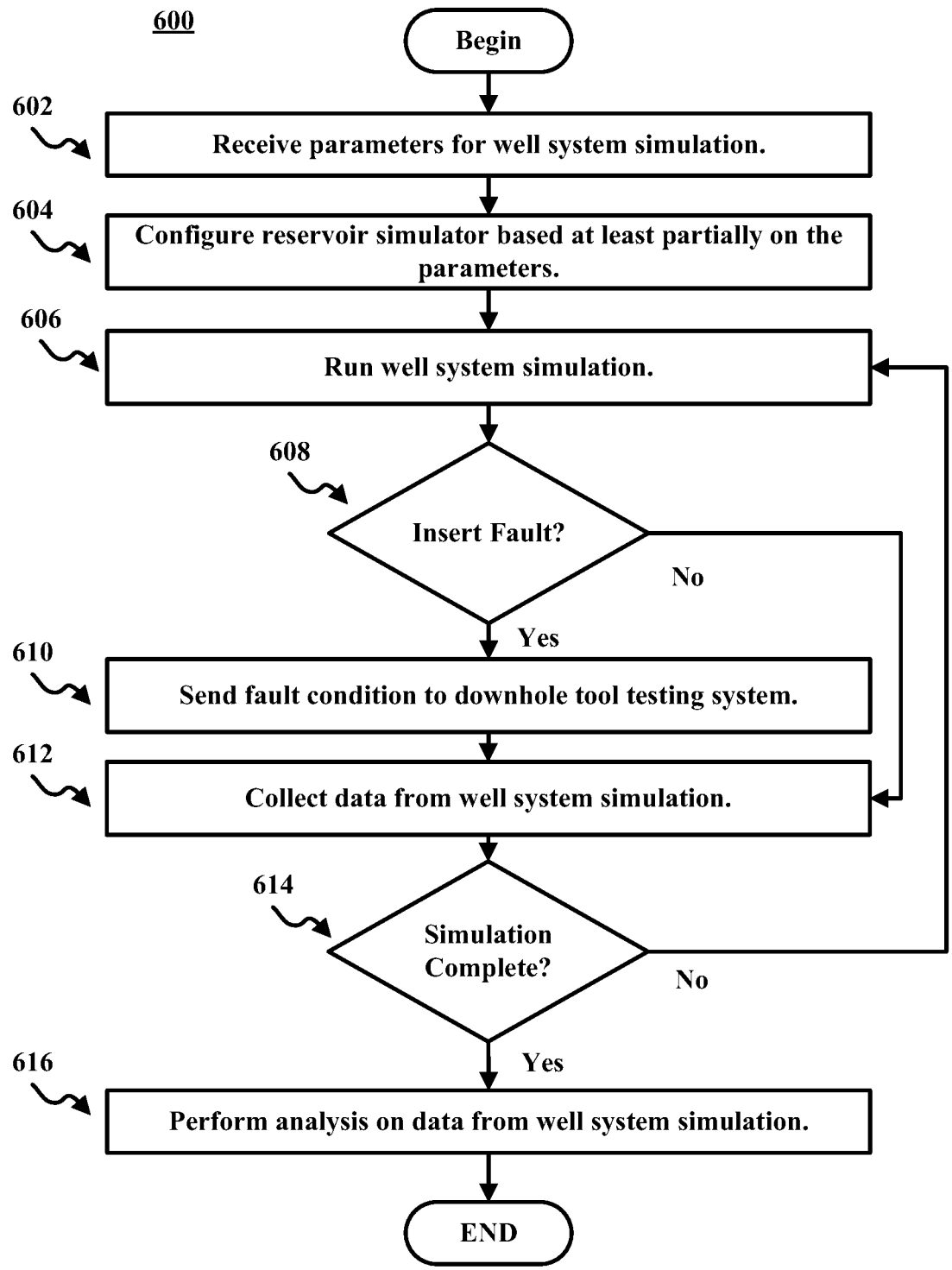
FIG. 6 illustrates a flowchart of an example of a method for testing an emulated downhole tool according to an embodiment.

As discussed above, the system 100 may be utilized to test physical components of downhole tools. FIG. 6 illustrates a flowchart of a method 600 for testing the physical components of downhole tools. As illustrated in FIG. 6, the method 600 may begin with receiving parameters for the well system simulation, in operation 602. The parameters may include any data that may be utilized to perform the well system simulation. For example, the parameters may include a particular well to perform the well system simulation, an identification of the downhole tools tested, an initial state of the well system to be simulated, and other initialization parameters. In embodiments, the one or more of the parameters may be provided by a user of the system 100, described above. For example, in some embodiments, the one or more of the parameters may be provided by a user of the system 100, for example, using the control system 102. In some embodiments, the one or more of the parameters may be collected by or determined independently by any component of the system 100, for example, one or more of the control system 102, the surface system simulator 104, the real-time acquisition system 106, the reservoir simulator 108, and the downhole tool testing system 110.

In operation 604, the reservoir simulator may be configured based at least partially on the parameters. In embodiments, for example, based on the parameters, the reservoir simulator 108 may configure one or more reservoir models for generating one or more conditions for wellbore. In some embodiments, for example, based on the parameters, an initial downhole conditions may be generated by the reservoir simulator 108 such as initial location of the downhole tools of the downhole tool testing system 110, and initial conditions at the initial location such as pressure in the wellbore, temperature in the wells bore, position of the downhole tools, flow rates of fluid in the wellbore, rate of penetration of the a drill, geological structure and formations in the wellbore, and the like.

In operation 606, the well system simulation may be run. For example, the initial conditions may be sent to the downhole tool testing system 110. The initial conditions may be received by the downhole tool emulators and passed to the physical components of the downhole tool included in the downhole tool emulators. The data from the physical components of the downhole tool may then be transmitted to the surface system simulator 104 and the real-time acquisition system 106. In embodiments, as the simulation proceeds, a user may provide commands to the surface system simulator 104 that represent operation of the downhole tools. The commands and the data collected from the downhole tool testing system 110 may be sent to the reservoir simulator 108. The reservoir simulator 108 may generate new conditions based on the commands and the data collected from the downhole tool testing system 110 that represent changes based on the operation of the downhole tools. The process may be repeated as new data is received from the downhole tools and the user provides new commands.

In operation 608, it may be determined if a fault is to be inserted into the system. For example, in some embodiments, a user of the system 100 may desire to test the response of the one or more downhole tool emulators in the downhole tool testing system 110 to fault conditions. For example, the user of the system 100 may desire to test a response of the physical components of the downhole tools to the fault. A fault condition may be any condition that represents an anomalous operation of the physical components, for example, a malfunction, a failure, and the like.

If a fault is inserted, in operation 610, a fault condition may be sent to the downhole tool testing system 110. In embodiments, the fault condition may be one or more signals that cause one or more physical components of the downhole tool emulators to enter a fault condition. In some embodiments, the fault condition may be sent by the control system 102 to the downhole tool testing system 110. In some embodiments, the fault condition may be sent by another component of the system 100, for example, the reservoir simulator 108, the real-time acquisition system 106, or the surface system simulator 104.

In some embodiments, for example, the fault condition may be received by the embedded hardware and tool emulator 150 of the downhole tool emulator 112. In response, the embedded hardware and tool emulator 150 may convert the fault condition to an electrical signal that matches the physical component. The electrical signal may then be sent to the physical component and the response may be output over the telemetry interface 154.

In operation 612, after the fault is inserted, data may be collected from the well system simulation. In some embodiments, the data collected may include the response of physical components of the downhole tool emulators to the fault conditions. In some embodiments, the data may include the data output by the downhole tool testing system 110, the commands and actions by a user on the surface system simulator 104, the model used by the reservoir simulator 108, the one or more conditions generated by the reservoir simulator during the simulation, and the like. In some embodiments, for example, the data may be collected by the control system 102. In some embodiments, the data may be collected by any of the components of the system 100. In some embodiments, if a fault condition is not inserted in operation 608, method 600 may proceed to operation 612 to collect data.

In operation 614, it may be determined if the well system simulation is complete. If the well system simulation is still in progress, method 600 may return to operation 606 to continue simulation, to optionally insert new fault conditions, and to continue to collect data.

If the well system simulation is complete, an analysis may be performed on the data from the well system simulation, in operation 614. In some embodiments, the analysis may be performed to determine the function of components of the simulated well system or a user interaction with the simulated well system. In some embodiments, for example, the data collected may be analyzed to determine if the downhole tools operated properly. For example, the fault conditions sent to the downhole tool emulators may be matched to the data, for example, the responses to the fault conditions that were generated by the physical components of the downhole tool emulators. Based on the analysis, it may be determined if the physical components of the downhole tool emulators responded properly to the fault conditions.

In some embodiments, for example, the data may be analyzed to determine if the user of the simulated surface system simulator 104 responded properly to the fault condition. For example, the data representing the commands entered at the surface system simulator 104 may be collected and compared to an expected response of the user.

Figure 7A:
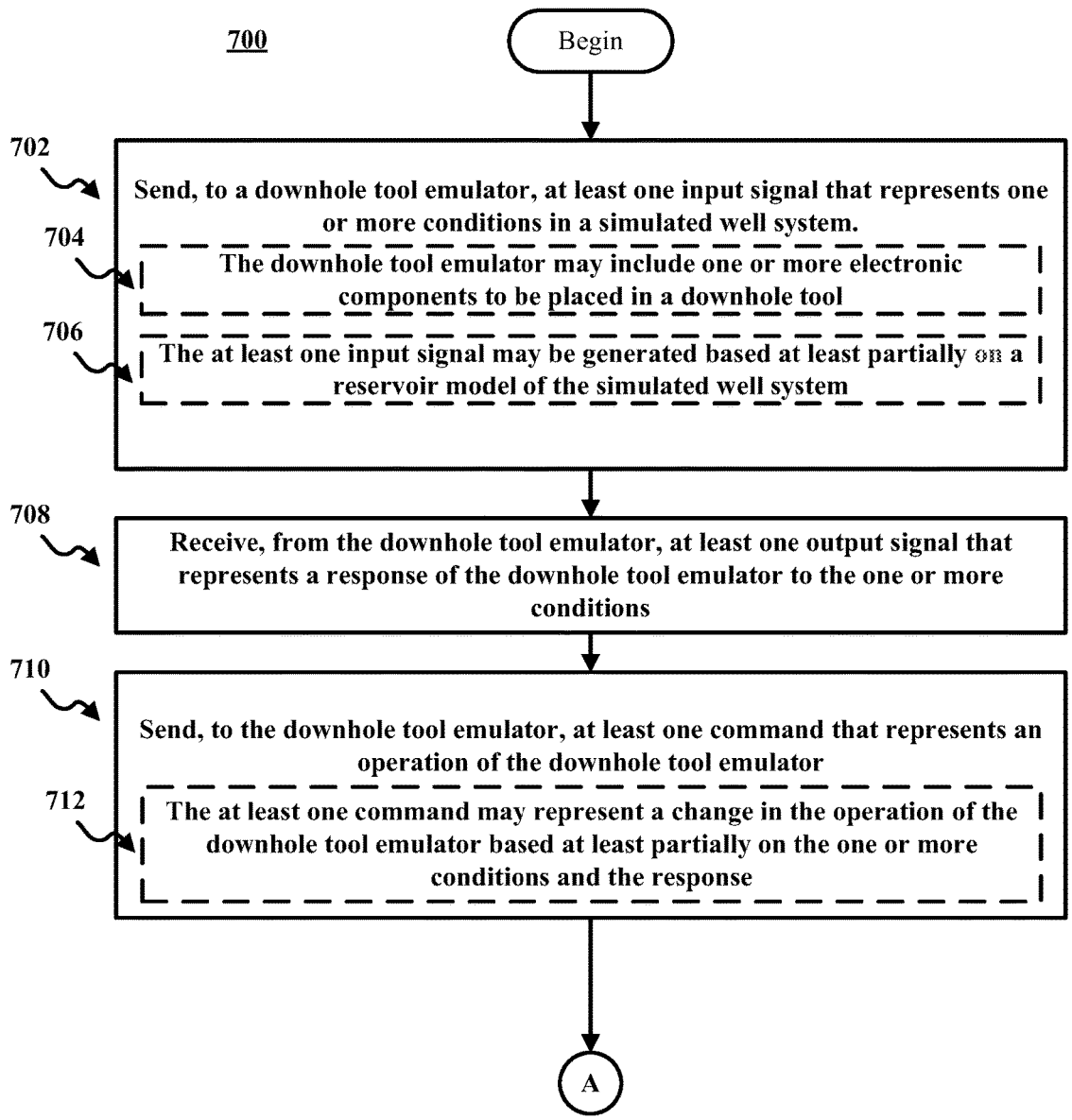
FIGS. 7A and 7B illustrate flowcharts of another example of a method for simulating a well system according to an embodiment.
Figure 7B:
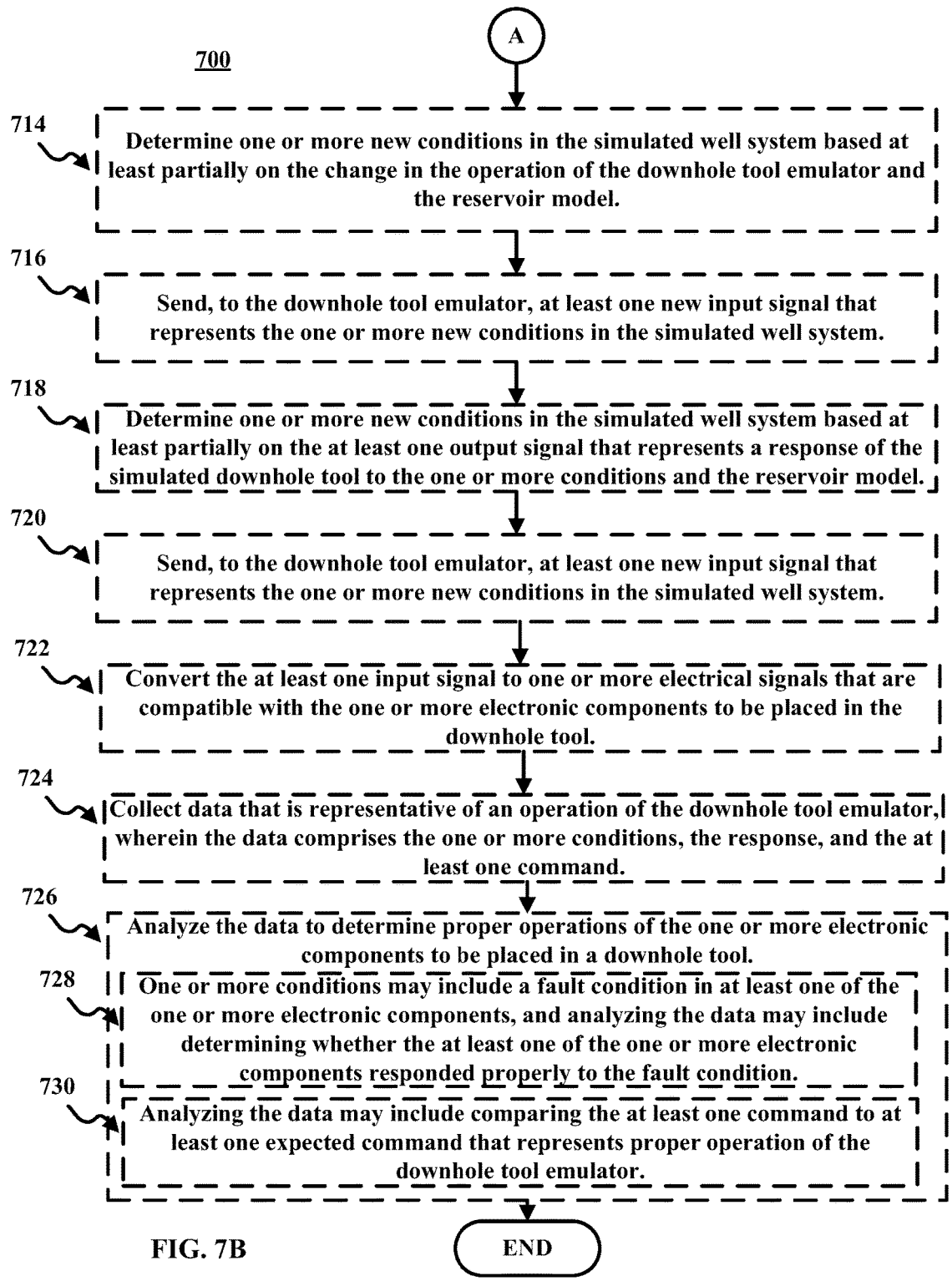

Attention is now directed to FIGS. 7A and 7B, which illustrate a flowchart depicting a method 700 for simulating a well system, in accordance with some embodiments. Some operations in method 700 may be combined and/or the order of some operations may be changed. Further, some operations in method 700 may be combined with aspects of the example workflows of FIGS. 3, 4, 5, and 6, and/or the order of some operations in method 700 may be changed to account for incorporation of aspects of the workflow illustrated by one or more of FIGS. 3, 4, 5, and 6.

The method 700 may begin at operation 702. In operation 702, at least one input signal that represents one or more conditions in a simulated well system may be sent to a downhole tool emulator (e.g., FIGS. 3, 304 and 306, determine reservoir model and initial downhole conditions and perform real-time well system simulation; FIG. 4, 406, begin well system simulation). In an embodiment, in 704, the downhole tool emulator may comprise one or more electronic components to be placed in a downhole tool (e.g., FIGS. 1, 110, 112, 114, and 116; FIG. 2C, 110 and 112). In an embodiment, in 706, the at least one input signal may be generated based at least partially on a reservoir model of the simulated well system (e.g., FIGS. 3, 304 and 306, determine reservoir model and initial downhole conditions and perform real-time well system simulation; FIG. 4, 406, begin well system simulation).

In operation 708, at least one output signal that represents a response of the downhole tool emulator to the one or more conditions may be received from the downhole tool emulator (e.g., FIGS. 3, 304 and 306, determine reservoir model and initial downhole conditions and perform real-time well system simulation; FIG. 4, 406, 408 begin well system simulation and collect data from well simulation; FIG. 5, 508 transmit data from physical components to surface system simulator).

In operation 710, at least one command that represents an operation of the downhole tool emulator may be sent to the downhole tool emulator (e.g., FIGS. 3, 304 and 306, determine reservoir model and initial downhole conditions and perform real-time well system simulation; FIG. 4, 406, 408 begin well system simulation and collect data from well simulation; FIG. 5, 508 transmit data from physical components to surface system simulator). In an embodiment, at 712, the at least one command may represent a change in the operation of the downhole tool emulator based at least partially on the one or more conditions and the response.

In an embodiment, at operation 714, one or more new conditions in the simulated well system may be determined based at least partially on the change in the operation of the downhole tool emulator and the reservoir model (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 716, at least one new input signal that represents the one or more new conditions in the simulated well system may be sent, to the downhole tool emulator (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 718, one or more new conditions in the simulated well system may be determined based at least partially on the at least one output signal that represents a response of the simulated downhole tool to the one or more conditions and the reservoir model (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 720, at least one new input signal that represents the one or more new conditions in the simulated well system may be sent to the downhole tool emulator (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 722, the at least one input signal may be converted to one or more electrical signals that are compatible with the one or more electronic components to be placed in the downhole tool (e.g., FIG. 5).

In an embodiment, at operation 724, data may be collected that is representative of an operation of the downhole tool emulator, wherein the data comprises the one or more conditions, the response, and the at least one command (e.g., FIG. 3, 308, collect data from real-time simulation; FIG. 4, 408, 410 collect data from well simulation).

In an embodiment, at operation 726, the data may be analyzed to determine proper operations of the one or more electronic components to be placed in a downhole tool (e.g., FIG. 3, 310, perform analysis on data from well system simulation; FIG. 4, 412 perform analysis on data from well system simulation). In an embodiment, at operation 728, the one or more conditions may include a fault condition in at least one of the one or more electronic components, and analyzing the data may include determining whether the at least one of the one or more electronic components responded properly to the fault condition (e.g., FIG. 6). In an embodiment, at operation 730, analyzing the data may include comparing the at least one command to at least one expected command that represents proper operation of the downhole tool emulator.

Figure 8A:
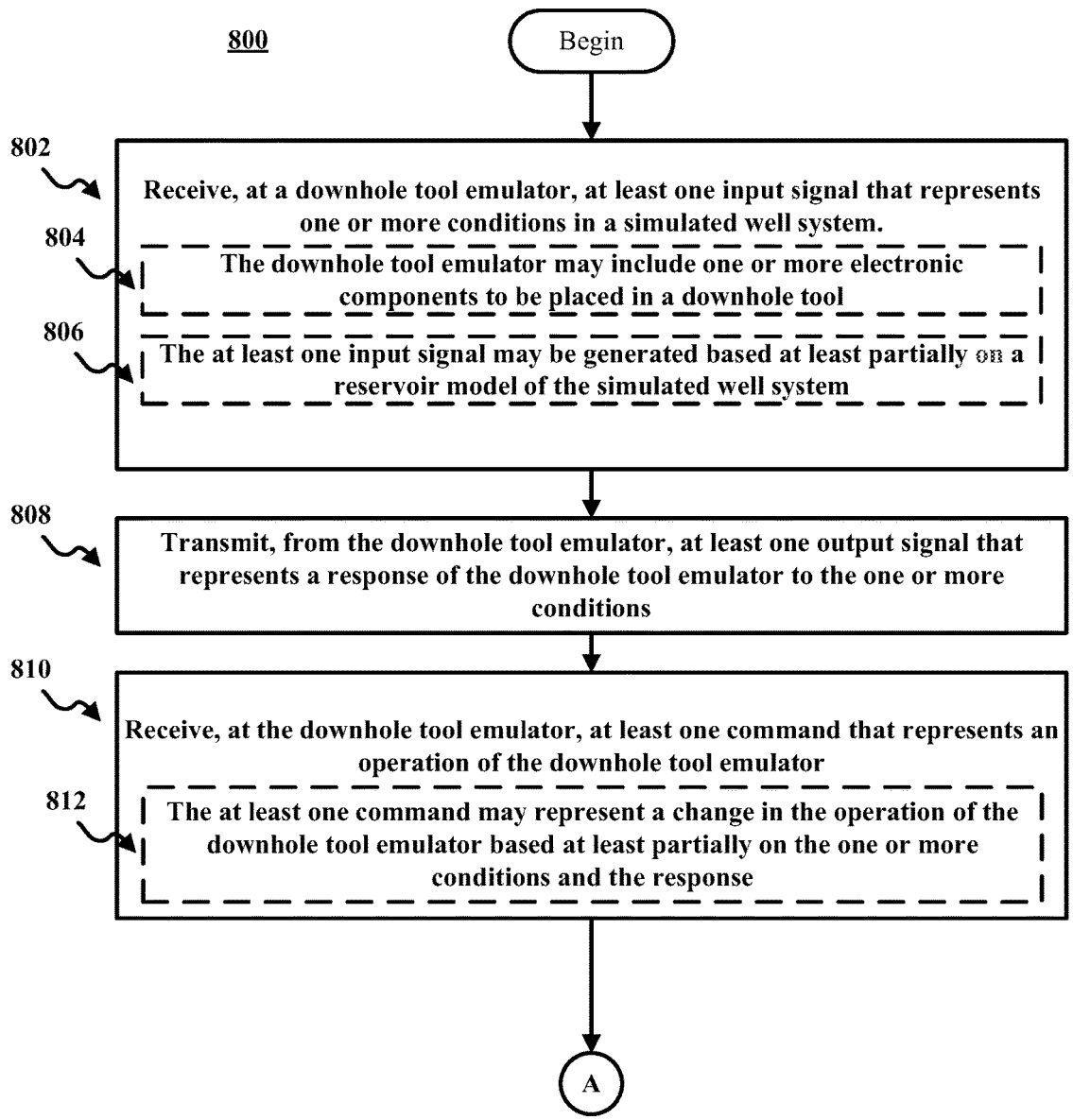
FIGS. 8A and 8B illustrate flowcharts of another example of a method for simulating a well system according to an embodiment.
Figure 8B:
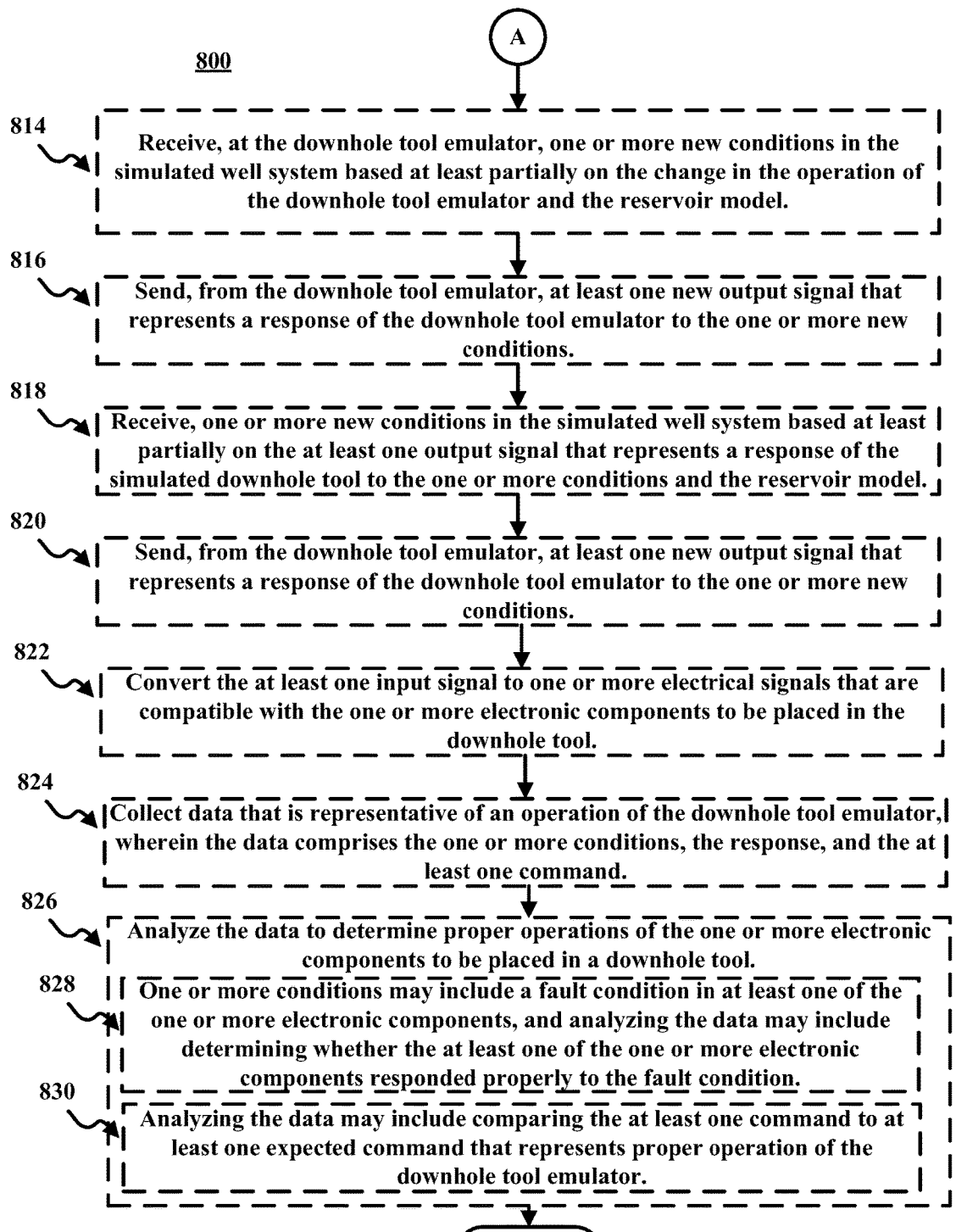

Attention is now directed to FIGS. 8A and 8B, which illustrate a flowchart depicting a method 800 for simulating a well system, in accordance with some embodiments. Some operations in method 800 may be combined and/or the order of some operations may be changed. Further, some operations in method 800 may be combined with aspects of the example workflows of FIGS. 3, 4, 5, and 6, and/or the order of some operations in method 800 may be changed to account for incorporation of aspects of the workflow illustrated by one or more of FIGS. 3, 4, 5, and 6.

The method 800 may begin at operation 802. In operation 802, at least one input signal that represents one or more conditions in a simulated well system may be received at a downhole tool emulator (e.g., FIGS. 3, 304 and 306, determine reservoir model and initial downhole conditions and perform real-time well system simulation; FIG. 4, 406, begin well system simulation). In an embodiment, in 804, the downhole tool emulator may comprise one or more electronic components to be placed in a downhole tool (e.g., FIGS. 1, 110, 112, 114, and 116; FIG. 2C, 110 and 112). In an embodiment, in 806, the at least one input signal may be generated based at least partially on a reservoir model of the simulated well system (e.g., FIGS. 3, 304 and 306, determine reservoir model and initial downhole conditions and perform real-time well system simulation; FIG. 4, 406, begin well system simulation).

In operation 808, at least one output signal that represents a response of the downhole tool emulator to the one or more conditions may be transmitted from the downhole tool emulator (e.g., FIGS. 3, 304 and 306, determine reservoir model and initial downhole conditions and perform real-time well system simulation; FIG. 4, 406, 408 begin well system simulation and collect data from well simulation; FIG. 5, 508 transmit data from physical components to surface system simulator).

In operation 810, at least one command that represents an operation of the downhole tool emulator may be received at the downhole tool emulator (e.g., FIGS. 3, 304 and 306, determine reservoir model and initial downhole conditions and perform real-time well system simulation; FIG. 4, 406, 408 begin well system simulation and collect data from well simulation; FIG. 5, 508 transmit data from physical components to surface system simulator). In an embodiment, at 812, the at least one command may represent a change in the operation of the downhole tool emulator based at least partially on the one or more conditions and the response.

In an embodiment, at operation 814, one or more new conditions in the simulated well system based at least partially on the change in the operation of the downhole tool emulator and the reservoir model may be received at the downhole tool emulator (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 816, at least one new output signal that represents a response of the downhole tool emulator to the one or more new conditions may be sent from the downhole tool emulator (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 818, one or more new conditions in the simulated well system based at least partially on the at least one output signal that represents a response of the simulated downhole tool to the one or more conditions and the reservoir model may be sent to the downhole tool emulator (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 820, at least one new output signal that represents a response of the downhole tool emulator may to the one or more new conditions may be sent from the downhole tool emulator (e.g., FIGS. 3, 304 and 306, determine reservoir model and initial downhole conditions and perform real-time well system simulation; FIG. 4, 406, 408, 410 begin well system simulation and collect data from well simulation; FIG. 5, 510).

In an embodiment, at operation 822, the at least one input signal may be converted to one or more electrical signals that are compatible with the one or more electronic components to be placed in the downhole tool (e.g., FIG. 5).

In an embodiment, at operation 824, data may be collected that is representative of an operation of the downhole tool emulator, wherein the data comprises the one or more conditions, the response, and the at least one command (e.g., FIG. 3, 308, collect data from real-time simulation; FIG. 4, 408, 410 collect data from well simulation).

In an embodiment, at operation 826, the data may be analyzed to determine proper operations of the one or more electronic components to be placed in a downhole tool (e.g., FIG. 3, 310, perform analysis on data from well system simulation; FIG. 4, 412 perform analysis on data from well system simulation). In an embodiment, at operation 828, the one or more conditions may include a fault condition in at least one of the one or more electronic components, and analyzing the data may include determining whether the at least one of the one or more electronic components responded properly to the fault condition (e.g., FIG. 6). In an embodiment, at operation 830, analyzing the data may include comparing the at least one command to at least one expected command that represents proper operation of the downhole tool emulator.

In one or more embodiments, the functions described may be implemented in hardware, software, firmware, or any combination thereof. For a software implementation, the techniques described herein may be implemented with modules (e.g., procedures, functions, subprograms, programs, routines, subroutines, modules, software packages, classes, and so on) that perform the functions described herein. A module may be coupled to another module or a hardware circuit by passing and/or receiving information, data, arguments, parameters, or memory contents. Information, arguments, parameters, data, or the like may be passed, forwarded, or transmitted using any suitable means including memory sharing, message passing, token passing, network transmission, and the like. The software codes may be stored in memory units and executed by processors. The memory unit may be implemented within the processor or external to the processor, in which case it may be communicatively coupled to the processor via various means as is known in the art.

Figure 9:
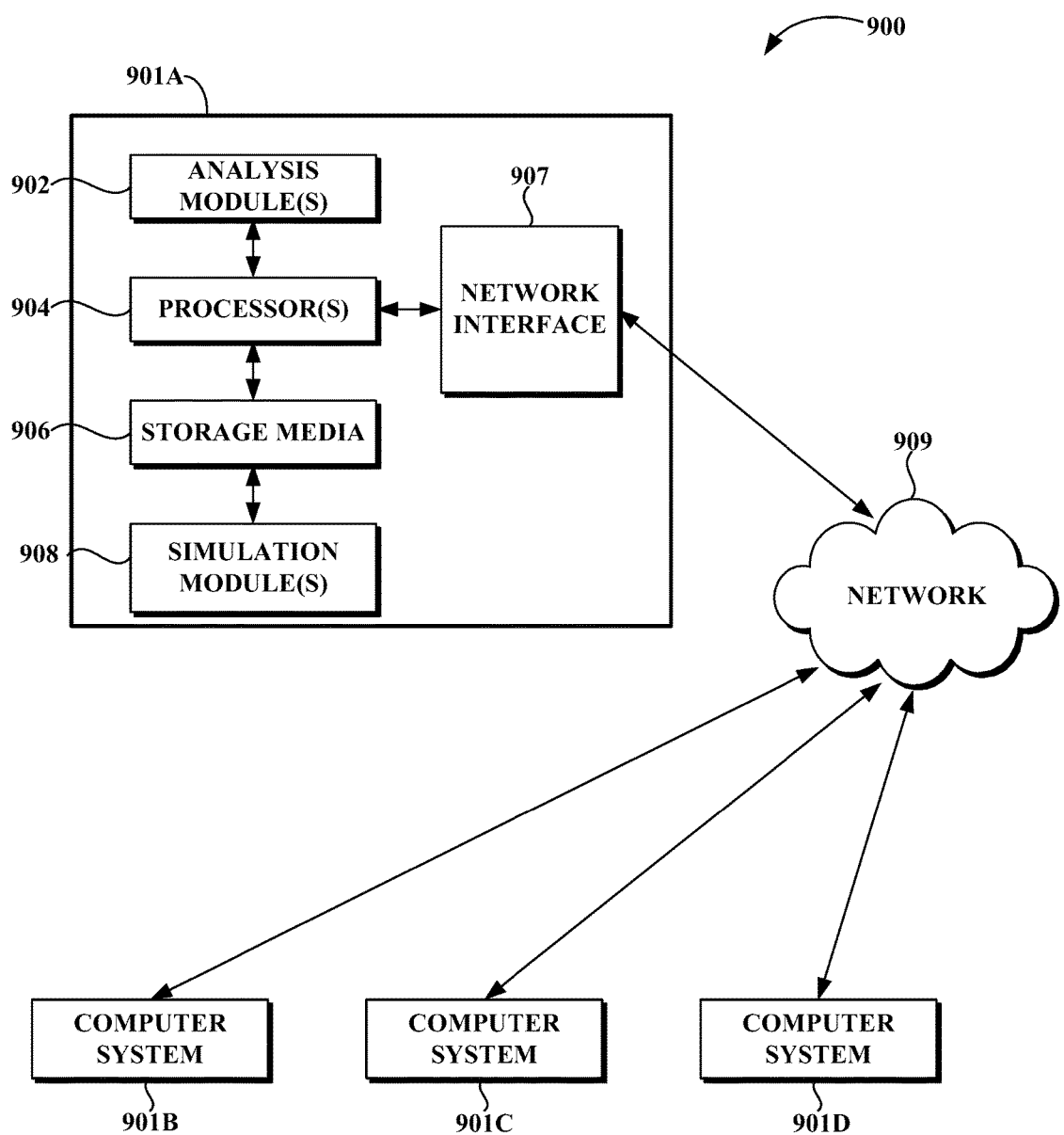
FIG. 9 illustrates a schematic view of a computing system, according to an embodiment.

In some embodiments, any of the methods 300, 400, 500, 600, 700, and 800 may be executed by a computing system. FIG. 9 illustrates an example of such a computing system 900, in accordance with some embodiments. The computing system 900 may include a computer or computer system 901A, which may be an individual computer system 901A or an arrangement of distributed computer systems. The computer system 901A includes one or more analysis module(s) 902 configured to perform various tasks according to some embodiments, such as one or more methods disclosed herein (e.g., methods 300, 400, 500, 600, 700, and 800 and/or combinations and/or variations thereof). To perform these various tasks, the analysis module 902 executes independently, or in coordination with, one or more processors 904, which is (or are) connected to one or more storage media 906. The processor(s) 904 is (or are) also connected to a network interface 907 to allow the computer system 901A to communicate over a data network 909 with one or more additional computer systems and/or computing systems, such as 901B, 901C, and/or 901D (note that computer systems 901B, 901C and/or 901D may or may not share the same architecture as computer system 901A, and may be located in different physical locations, e.g., computer systems 901A and 901B may be located in a processing facility, while in communication with one or more computer systems such as 901C and/or 901D that are located in one or more data centers, and/or located in varying countries on different continents).

A processor may include a microprocessor, microcontroller, processor module or subsystem, programmable integrated circuit, programmable gate array, or another control or computing device.

The storage media 906 may be implemented as one or more computer-readable or machine-readable storage media. Note that while in the example embodiment of FIG. 9 storage media 906 is depicted as within computer system 901A, in some embodiments, storage media 906 may be distributed within and/or across multiple internal and/or external enclosures of computing system 901A and/or additional computing systems. Storage media 906 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUE RAY® disks, or other types of optical storage, or other types of storage devices. Note that the instructions discussed above may be provided on one computer-readable or machine-readable storage medium, or alternatively, may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 900 contains one or more simulation modules 908. In the example of computing system 900, computer system 901A includes the simulation module 908. In some embodiments, a single simulation module may be used to perform some or all aspects of one or more embodiments of the methods 300, 400, 500, 600, 700, and 800. In alternate embodiments, a plurality of simulation modules may be used to perform some or all aspects of methods 300, 400, 500, 600, 700, and 800.

It should be appreciated that computing system 900 is only one example of a computing system, and that computing system 900 may have more or fewer components than shown, may combine additional components not depicted in the example embodiment of FIG. 9, and/or computing system 900 may have a different configuration or arrangement of the components depicted in FIG. 9. The various components shown in FIG. 9 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are all included within the scope of protection of the invention.

Geologic interpretations, models and/or other interpretation aids may be refined in an iterative fashion; this concept is applicable to methods 300, 400, 500, 600, 700, and 800 as discussed herein. This may include use of feedback loops executed on an algorithmic basis, such as at a computing device (e.g., computing system 900, FIG. 9), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods 300, 400, 500, 600, 700, and 800 are illustrated and described may be re-arranged, and/or two or more elements may occur simultaneously. The embodiments were chosen and described in order to best explain the principals of the invention and its practical applications, to thereby enable others skilled in the art to best utilize the invention and various embodiments with various modifications as are suited to the particular use contemplated.

What is claimed is:

1. A method, comprising:
    sending, to a downhole tool emulator, at least one input signal that represents one or more conditions in a simulated well system,
        wherein the downhole tool emulator comprises one or more electronic components to be placed in a downhole tool, and
        wherein the at least one input signal is generated based at least partially on a reservoir model of the simulated well system;
    receiving, from the downhole tool emulator, at least one output signal that represents a response of the downhole tool emulator to the one or more conditions; and
    sending, to the downhole tool emulator, at least one command that represents an operation of the downhole tool emulator, wherein the at least one command represents a change in the operation of the downhole tool emulator based at least partially on the one or more conditions and the response.

2. The method of claim 1, further comprising:
    determining one or more new conditions in the simulated well system based at least partially on the change in the operation of the downhole tool emulator and the reservoir model; and
    sending, to the downhole tool emulator, at least one new input signal that represents the one or more new conditions in the simulated well system.

3. The method of claim 1, further comprising:
    determining one or more new conditions in the simulated well system based at least partially on the at least one output signal that represents the response of the downhole tool emulator to the one or more conditions and the reservoir model; and
    sending, to the downhole tool emulator, at least one new input signal that represents the one or more new conditions in the simulated well system.

4. The method of claim 1, further comprising:
    converting the at least one input signal to one or more electrical signals that are compatible with the one or more electronic components to be placed in the downhole tool.

5. The method of claim 1, further comprising:
    collecting data that is representative of an operation of the downhole tool emulator, wherein the data comprises the one or more conditions, the response, and the at least one command; and
    analyzing the data to determine proper operations of the one or more electronic components to be placed in a downhole tool.

6. The method of claim 5, wherein the one or more conditions comprise a fault condition in at least one of the one or more electronic components, and
    wherein analyzing the data comprises determining whether the at least one of the one or more electronic components responded properly to the fault condition.

7. The method of claim 5, wherein analyzing the data comprises comparing the at least one command to at least one expected command that represents proper operation of the downhole tool emulator.

8. A method, comprising:
    receiving, at a downhole tool emulator, at least one input signal that represents one or more conditions in a simulated well system,
        wherein the downhole tool emulator comprises one or more electronic components to be placed in a downhole tool, and wherein the at least one input signal is generated based at least partially on a reservoir model of the simulated well system;

transmitting, from the downhole tool emulator, at least one output signal that represents a response of the downhole tool emulator to the one or more conditions; and receiving, at the downhole tool emulator, at least one command that represents an operation of the downhole tool emulator, wherein the at least one command represents a change in the operation of the downhole tool emulator based at least partially on the one or more conditions and the response.

9. The method of claim 8, further comprising:
receiving, at the downhole tool emulator, one or more new conditions in the simulated well system based at least partially on the change in the operation of the downhole tool emulator and the reservoir model; and
sending, from the downhole tool emulator, at least one new output signal that represents a response of the downhole tool emulator to the one or more new conditions.

10. The method of claim 8, further comprising:
receiving, at the downhole tool emulator, one or more new conditions in the simulated well system based at least partially on the at least one output signal that represents the response of the downhole tool emulator to the one or more conditions and the reservoir model; and
sending, from the downhole tool emulator, at least one new one new output signal that represents a response of the downhole tool emulator to the one or more new conditions.

11. The method of claim 8, further comprising:
converting the at least one input signal to one or more electrical signals that are compatible with the one or more electronic components to be placed in the downhole tool.

12. The method of claim 8, the method further comprising:
collecting data that is representative of an operation of the downhole tool emulator, wherein the data comprises the one or more conditions, the response, and the at least one command; and
analyzing the data to determine proper operations of the one or more electronic components to be placed in a downhole tool.

13. The method of claim 12, wherein the one or more conditions comprise a fault condition in at least one of the one or more electronic components, and wherein analyzing the data comprises determining whether the at least one of the one or more electronic components responded properly to the fault condition.

14. The method of claim 12, wherein analyzing the data comprises comparing the at least one command to at least one expected command that represents proper operation of the downhole tool emulator.

15. A non-transitory computer-readable medium storing instructions that, when executed by at least one processor of a computing system, cause the computing system to perform operations, the operations comprising:
sending, to a downhole tool emulator, at least one input signal that represents one or more conditions in a simulated well system,
wherein the downhole tool emulator comprises one or more electronic components to be placed in a downhole tool, and
wherein the at least one input signal is generated based at least partially on a reservoir model of the simulated well system;
receiving, from the downhole tool emulator, at least one output signal that represents a response of the downhole tool emulator to the one or more conditions; and
sending, to the downhole tool emulator, at least one command that represents an operation of the downhole tool emulator, wherein the at least one command represents a change in the operation of the downhole tool emulator based at least partially on the one or more conditions and the response.

16. The non-transitory computer-readable medium of claim 15, wherein the operations further comprise:
determining one or more new conditions in the simulated well system based at least partially on the change in the operation of the downhole tool emulator and the reservoir model; and
sending, to the downhole tool emulator, at least one new input signal that represents the one or more new conditions in the simulated well system.

17. The non-transitory computer-readable medium of claim 15, wherein the operations further comprise:
determining one or more new conditions in the simulated well system based at least partially on the at least one output signal that represents the response of the downhole tool emulator to the one or more conditions and the reservoir model; and
sending, to the downhole tool emulator, at least one new input signal that represents the one or more new conditions in the simulated well system.

18. A computing system comprising:
one or more processors; and
a memory system comprising one or more non-transitory computer-readable media storing instructions that, when executed by at least one of the one or more processors, cause the computing system to perform operations, the operations comprising:
sending, to a downhole tool emulator, at least one input signal that represents one or more conditions in a simulated well system,
wherein the downhole tool emulator comprises one or more electronic components to be placed in a downhole tool, and
wherein the at least one input signal is generated based at least partially on a reservoir model of the simulated well system;
receiving, from the downhole tool emulator, at least one output signal that represents a response of the downhole tool emulator to the one or more conditions; and
sending, to the downhole tool emulator, at least one command that represents an operation of the downhole tool emulator, wherein the at least one command represents a change in the operation of the downhole tool emulator based at least partially on the one or more conditions and the response.

19. The computing system of claim 18, wherein the operations further comprise converting the at least one input signal to one or more electrical signals that are compatible with the one or more electronic components to be placed in the downhole tool.

20. The computing system of claim 18, wherein the operations further comprise:
collecting data that is representative of an operation of the downhole tool emulator, wherein the data comprises the one or more conditions, the response, and the at least one command; and analyzing the data to determine proper operations of the one or more electronic components to be placed in a downhole tool.

\* \* \* \* \*